(12) United States Patent
Nii

(10) Patent No.: US 7,024,524 B2
(45) Date of Patent: Apr. 4, 2006

(54) SEMICONDUCTOR STORAGE

(75) Inventor: Koji Nii, Tokyo (JP)

(73) Assignee: Renesas Technology Corp., Tokyo (JP)

(*) Notice: Subject to any disclaimer, the term of this patent is extended or adjusted under 35 U.S.C. 154(b) by 343 days.

(21) Appl. No.: 10/454,500

(22) Filed: Jun. 5, 2003

(65) Prior Publication Data

US 2004/0111571 A1 Jun. 10, 2004

(30) Foreign Application Priority Data

Dec. 10, 2002 (JP) ............................. 2002-357630

(51) Int. Cl.
*G06F 12/00* (2006.01)
(52) U.S. Cl. ..................... 711/154; 711/100; 711/117; 711/123; 711/136
(58) Field of Classification Search ................ 711/100, 711/111, 131, 149, 150, 154, 156, 117, 118, 711/123, 125, 136; 365/189.01, 233, 239
See application file for complete search history.

(56) References Cited

U.S. PATENT DOCUMENTS 4,964,083 A * 10/1990 Nogle et al. ............ 365/189.11
5,067,111 A * 11/1991 Asano et al. ........... 365/189.08
6,144,055 A * 11/2000 Takenaka .................... 257/301
6,169,684 B1 * 1/2001 Takahashi et al. ............ 365/49
6,195,278 B1 * 2/2001 Calin et al. .................... 365/49
6,229,758 B1 * 5/2001 Agata ......................... 365/233

FOREIGN PATENT DOCUMENTS

JP 6-349275 12/1994
JP 10-178110 6/1998

* cited by examiner

*Primary Examiner*—Tuan V. Thai
(74) *Attorney, Agent, or Firm*—Oblon, Spivak, McClelland, Maier & Neustadt, P.C.

(57) ABSTRACT

It is an object to obtain a semiconductor storage having a 1—chip structure which can be simultaneously accessed to memory cells present in different memory cell arrays. A 1-port memory cell array (11) provided with a word line (WL1) for a first port in common and a 2-port memory cell array (12) are provided together over one chip, thereby constituting a semiconductor storage. By selectively bringing any of a plurality of the word lines (WL1) for the first port into an active state by a row decoder (16), it is possible to simultaneously access respective memory cells of the 1-port memory cell array (11) and the 2-port memory cell array (12). By selectively bringing any of a plurality of word lines (WL2) for a second port into an active state by a row decoder (18), it is possible to singly access the 2-port memory cell array (12).

18 Claims, 26 Drawing Sheets

F I G . 1 0
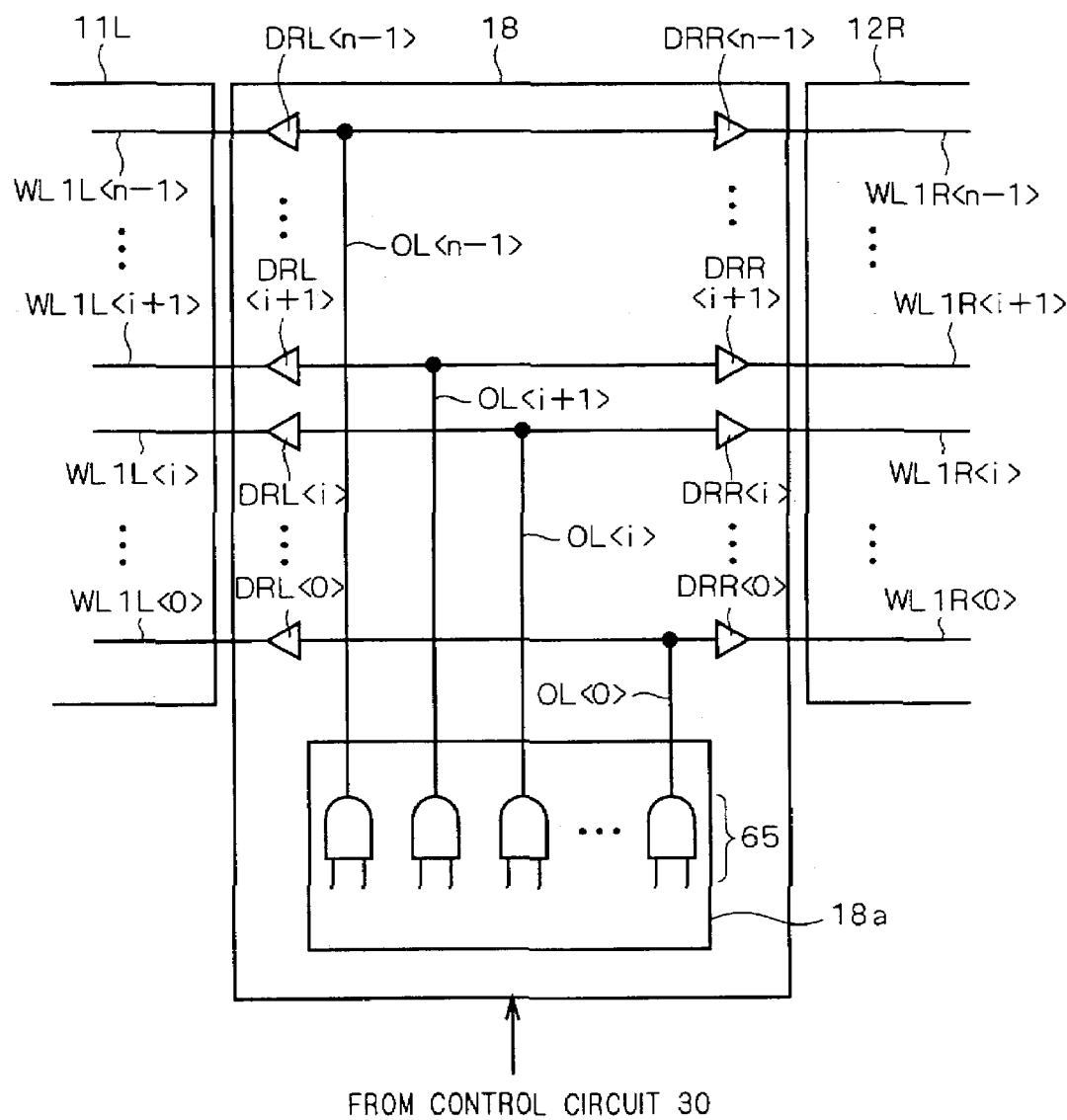
FROM CONTROL CIRCUIT 30

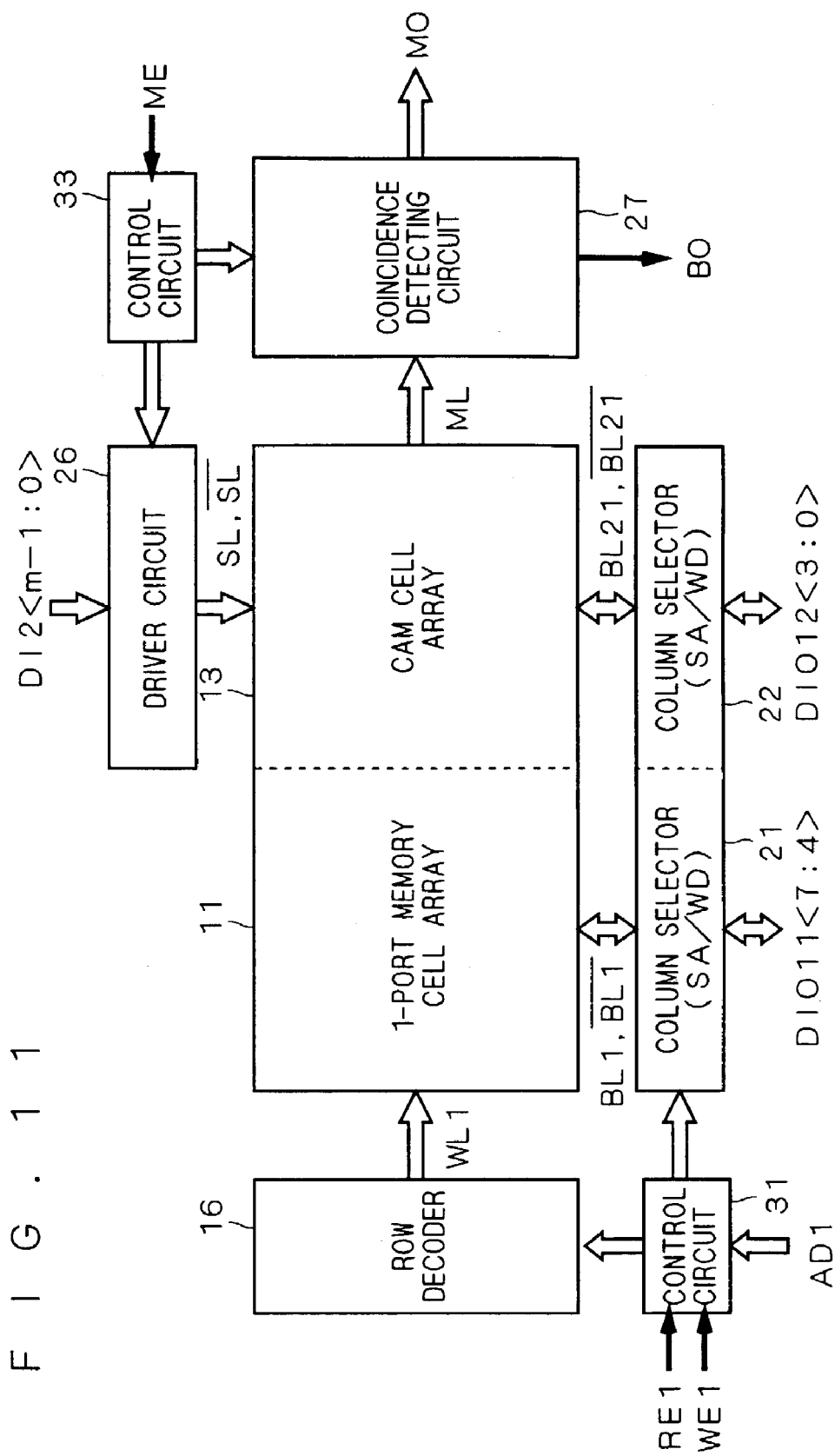
F I G . 1 1

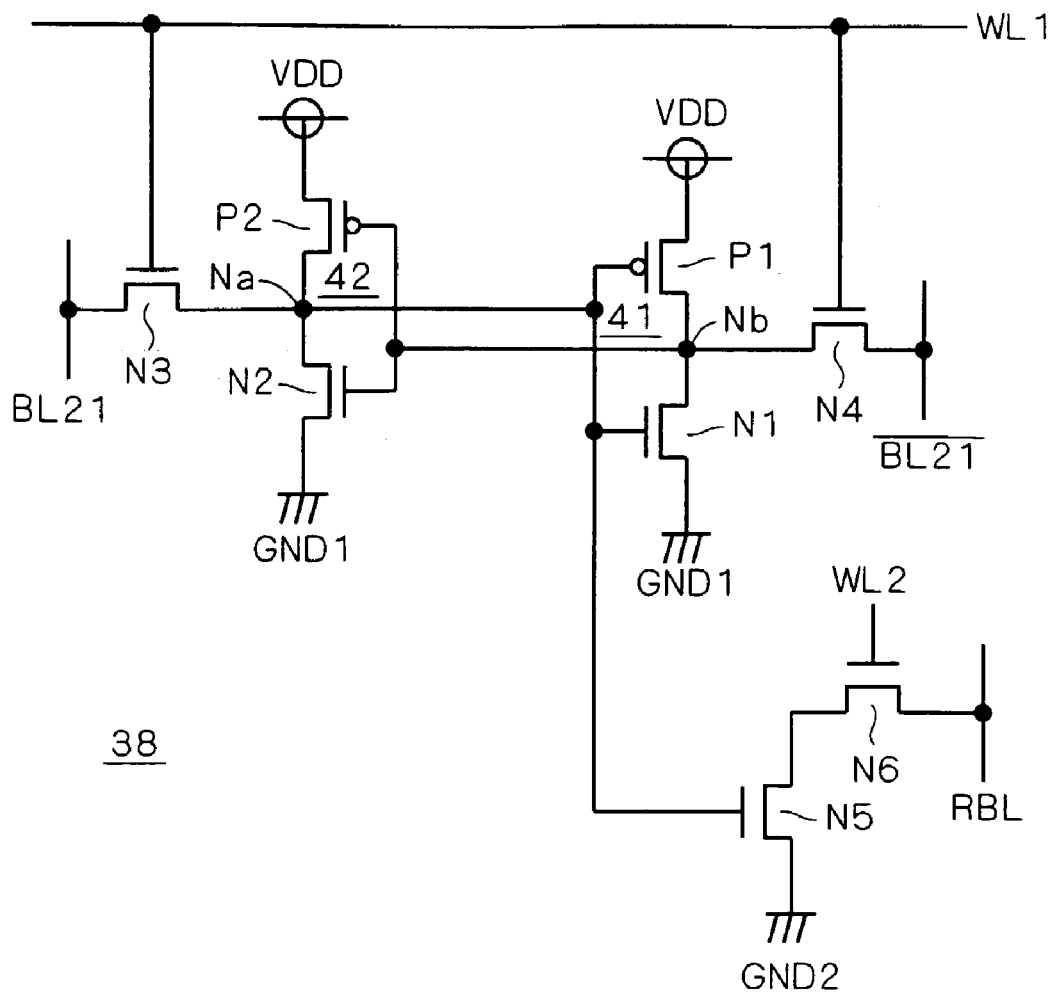
F I G . 2 0

SEMICONDUCTOR STORAGE

BACKGROUND OF THE INVENTION

1. Field of the Invention

The present invention relates to a semiconductor storage and more particularly to a combination of a plurality of memory cell structures of an MOS static RAM.

2. Description of the Background Art

For a semiconductor storage comprising plural kinds of memory cells having different port structures and the like, conventionally, a semiconductor storage has been disclosed in Patent Document 1 (Japanese Patent Application Laid-Open No. 6-349275 (1994) gazette), for example. The semiconductor storage comprises a 3-port cell section which is 3-port simultaneous accessible and a 1-port cell section having one access port, and can be implemented by connecting them to at least a pair of bit lines in common.

On the other hand, it has been demanded that data to be accessed on a bit length unit are divided on a several-bit unit and individual data are accessed on the several-bit unit thus obtained by the division in a computer field or the like. Moreover, it has also been demanded that a part of bits are constituted to be accessible from a plurality of ports.

In the semiconductor storage of the Patent Document 1 described above, however, the 3-port cell section and the 1-port cell section share a bit line. For this reason, there is a problem in that both of the port cell sections cannot be accessed at the same time and the demand cannot be met.

SUMMARY OF THE INVENTION

It is an object of the present invention to obtain a semiconductor storage having a one-chip structure in which memory cells present in different memory cell arrays can be accessed at the same time.

According to the present invention, a semiconductor storage includes first and second memory cell arrays and a first row decoder, and the first memory cell array includes a plurality of first memory cells and a plurality of first word lines. The plurality of first memory cells are arranged in at least one column over a plurality of rows and the plurality of first word lines are connected to the first memory cells on a row unit. On the other hand, the second memory cell array includes a plurality of second memory cells, a plurality of second and third word lines, and a plurality of first and second bit lines. The plurality of second memory cells are arranged in a matrix, the second word lines are connected to the second memory cells on a row unit, the plurality of third word lines are connected to the second memory cells on a row unit and are not connected to any of the plurality of first memory cells, and the plurality of first bit lines are provided corresponding to the second memory cells on a column unit and are accessible to the second memory cell connected to the second word line in a selection state out of the plurality of second word lines, and the plurality of second bit lines are provided corresponding to the second memory cells on a column unit and are accessible to the second memory cell connected to the third word line in a selection state out of the plurality of third word lines. The first row decoder simultaneously brings any of the first word lines and any of the second word lines into the selection state based on a first address signal.

The first and second memory cell arrays can be controlled by the first row decoder. Consequently, it is possible to obtain a semiconductor storage having a 1-chip structure which can be accessed to the first and second memory cells at the same time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is an explanatory diagram showing an internal structure of a row decoder in FIG. 9, FIG. 11 is a block diagram showing a structure of a semiconductor storage according to a fourth embodiment of the present invention, FIG. 20 is a circuit diagram showing a structure of a 2-port memory cell according to the sixth embodiment.

DESCRIPTION OF THE PREFERRED EMBODIMENTS

<First Embodiment>

(Whole Structure)

Figure 1:
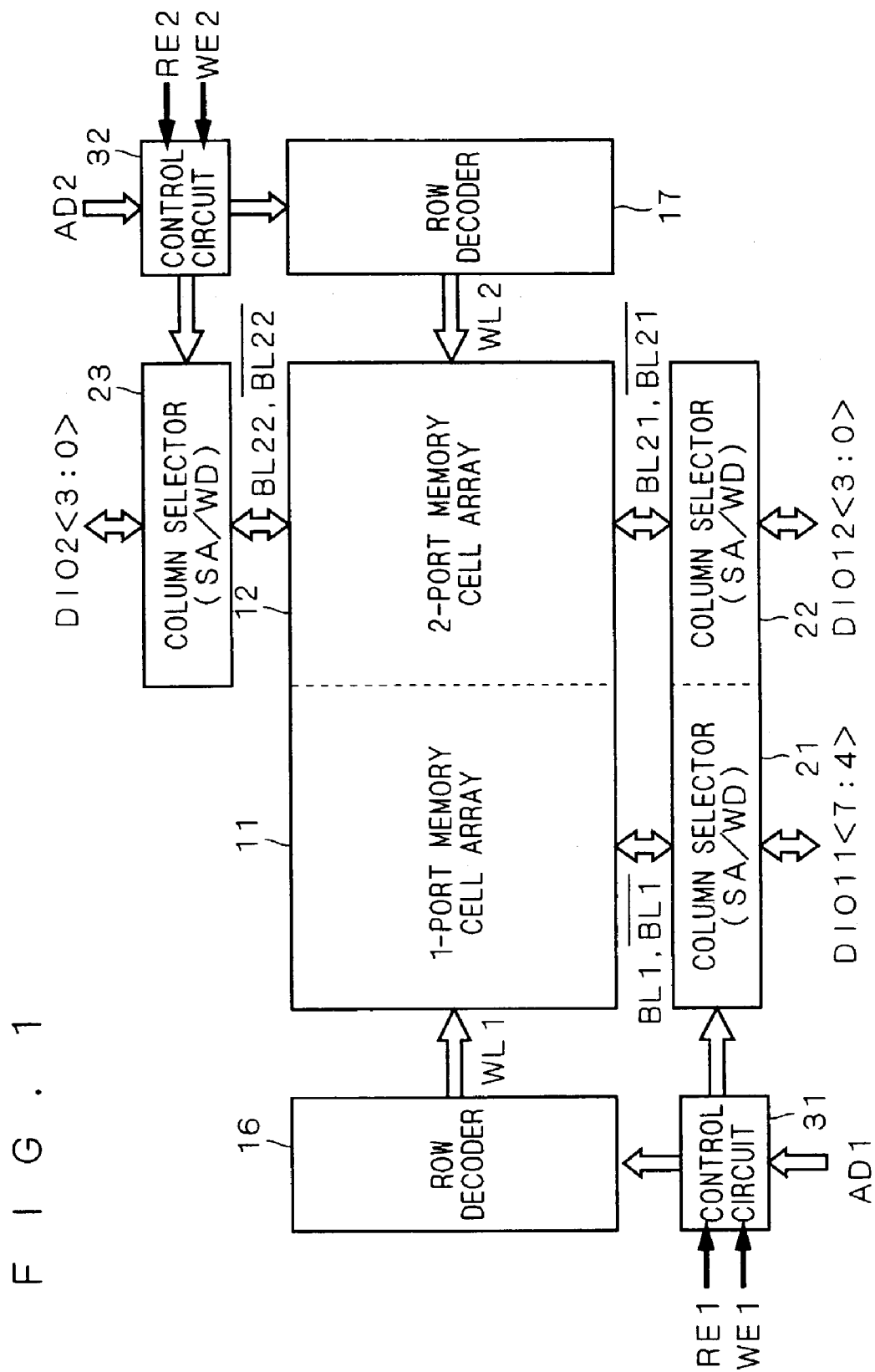
FIG. 1 is a block diagram showing a structure of a semiconductor storage according to a first embodiment of the present invention.

FIG. 1 is a block diagram showing a structure of a semiconductor storage according to a first embodiment of the present invention, As shown in FIG. 1, a 1-port memory cell array 11 (a first memory cell array) and a 2-port memory cell array 12 (a second memory cell array) are provided together over one chip to constitute a memory macro. More specifically, the 1-port memory cell array 11 is provided with a word line WL1 for a first port (a first word line (a common word line)) and the 2-port memory cell array 12 is provided with a word line WL1 for a first port (a second word line (a common word line)) and a word line WL2 for a second port (a third word line).

Upon receipt of an address input bus signal AD1, a control circuit 31 supplies a row address to a row decoder 16 (a first row decoder) and a column address to column selectors 21 and 22 under timing control of a read control input signal RE1 and a write control input signal WE1.

Upon receipt of an address input bus signal AD2, a control circuit 32 supplies a row address to a row decoder 17 (a second row decoder) and a column address to a column selector 23 under timing control of a read control input signal RE2 and a write control input signal WE2.

The row decoder 16 selectively sets any of a plurality of the word lines WL1 for the first port into an active state (a selection state) based on the row address and the row decoder 17 selectively sets any of a plurality of the word lines WL2 for the second port into the active state based on the row address.

The column selector 21 selects a portion equivalent to 4 bits from a plurality of bit line pairs BL1 and bar BL1 for the first port based on the column address sent from the control circuit 31 and inputs/outputs a data input/output bus signal DIO11<7:4> to/from the 1-port memory cell array 11 through the bit line pair BL1 and bar BL1 for the first port thus selected.

The column selector 22 selects a portion equivalent to 4 bits from a plurality of bit line pairs BL21 and bar BL21 for the first port (first bit lines) based on the column address sent from the control circuit 31 and inputs/outputs a data input/output bus signal DIO12<3:0> to/from the 2-port memory cell array 12 through the bit line pairs BL21 and bar BL21 for the first port thus selected.

The column selector 23 selects a portion equivalent to 4 bits from a plurality of bit line pairs BL22 and bar BL22 for the second port (second bit lines) based on the column address sent from the control circuit 32 and inputs/outputs a data input/output bus signal DIO2<3:0> to/from the 2-port memory cell array 12 through the bit line pairs BL22 and bar BL22 for the second port thus selected.

These column selectors 22 to 24 have a sense amplifier (SA) function and a write driving (WD) function.

(Memory Cell Structure)

Figure 2:
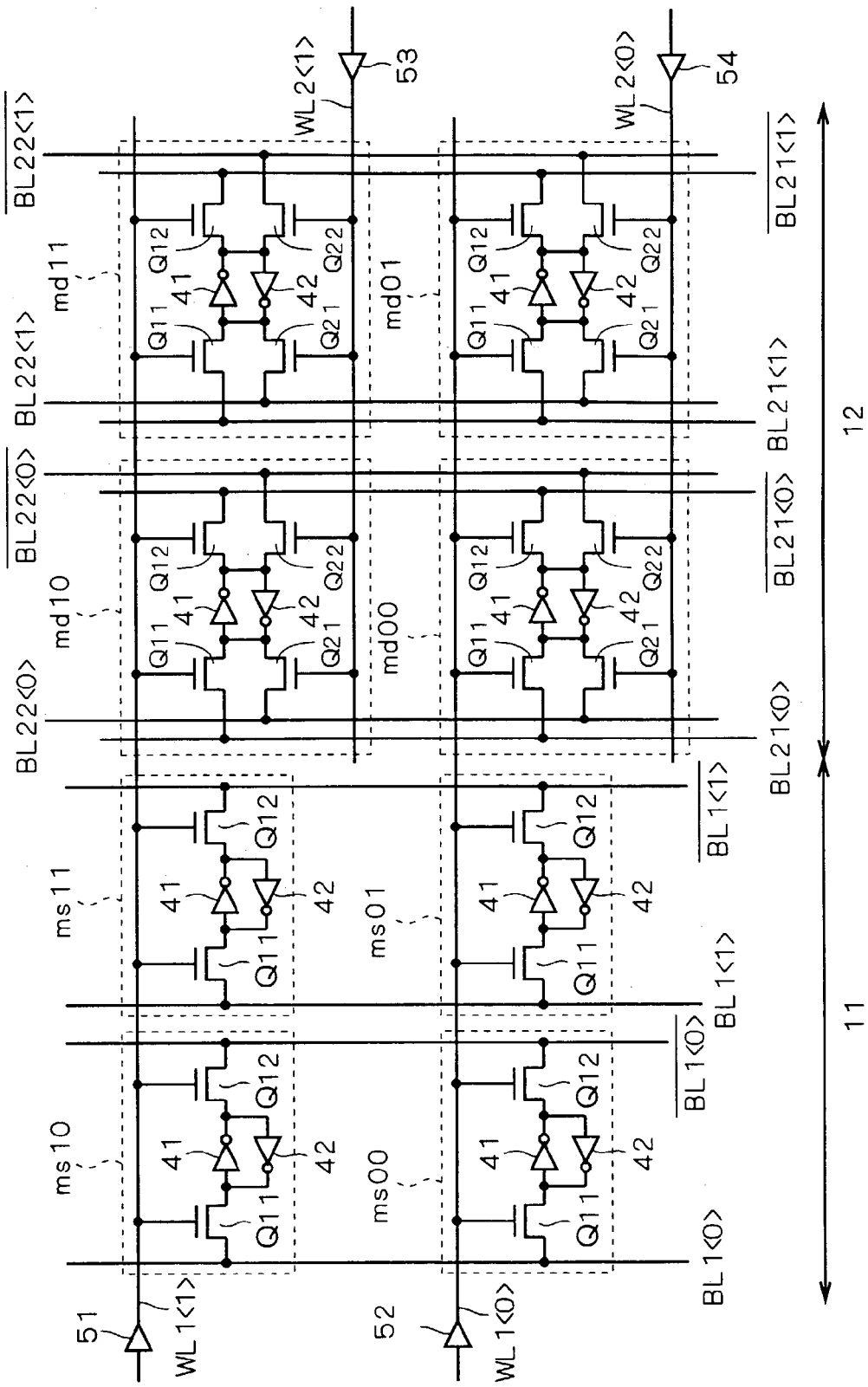
FIG. 2 is a circuit diagram showing a memory cell array structure according to the first embodiment.

FIG. 2 is a circuit diagram showing a memory cell array structure of the 1-port memory cell array 11 and the 2-port memory cell array 12. For convenience of explanation, FIG. 2 shows only a 2×2 memory cell but does not imply an actual size of the memory cell array (a matrix-like memory cell arrangement).

The 1-port memory cell array 11 is constituted by memory cells ms00, ms01, ms10 and ms11.

Each of the memory cells ms00 to ms11 is constituted by inverters 41 and 42 which are cross connected to each other, an NMOS transistor Q11 having one of electrodes connected to an input of the inverter 41 (an output of the inverter 42), and an NMOS transistor Q12 having one of electrodes connected to an input of the inverter 42 (an output of the inverter 41).

Word lines WL1<0> and WL1<1> for the first port are driven by drivers 52 and 51 (which are usually provided in the row decoder 16 (not shown)), respectively.

In the memory cells ms00 and ms01 on the same row, gate electrodes of the NMOS transistors Q11 and Q12 are electrically connected to the word line WL1<0> for the first port in common. In the memory cells ms10 and ms11 on the same row, gate electrodes of the NMOS transistors Q11 and Q12 are electrically connected to the word line WL1<1> for the first port in common.

Both of the memory cells ms00 and ms10 on the same column are provided between a bit line pair BL1<0> and bar BL1<0> for the first port. In these memory cells ms00 and ms10, the other electrode of the NMOS transistor Q11 is electrically connected to the bit line BL1<0> for the first port and the other electrode of the NMOS transistor Q12 is electrically connected to the inverted bit line bar BL1<0> for the first port.

Both of the memory cells ms01 and ms11 on the same column are provided between a bit line pair BL1<1> and bar BL1<1> for the first port. In the memory cells ms01 and ms11, the other electrode of the NMOS transistor Q11 is electrically connected to the bit line BL1<1> for the first port and the other electrode of the NMOS transistor Q12 is electrically connected to the inverted bit line bar BL1<1> for the first port.

On the other hand, the 2-port memory cell array 12 is constituted by memory cells md00, md01, md10 and md11.

Each of the memory cells md00 to md11 is constituted by the inverters 41 and 42 which are cross connected to each other, NMOS transistors Q11 and Q21 having electrodes connected to the input of the inverter 41, and NMOS transistors Q12 and Q22 having electrodes connected to the input of the inverter 42.

Word lines WL2<0> and WL2<1> for the second port are driven by drivers 54 and 53 (which are usually provided in the row decoder 17 (not shown)), respectively.

In the memory cells md00 and md01 on the same row, gate electrodes of the NMOS transistors Q11 and Q12 are electrically connected to the word line WL1<0> for the first port in common, and gate electrodes of the NMOS transistors Q21 and Q22 are electrically connected to the word line WL2<0> for the second port in common.

In the memory cells md10 and md11 on the same row, gate electrodes of the NMOS transistors Q11 and Q12 are electrically connected to the word line WL1<1> for the first port in common, and gate electrodes of the NMOS transistors Q21 and Q22 are electrically connected to the word line WL2<1> for the second port in common.

Both of the memory cells md00 and md10 on the same column are provided between a bit line pair BL21<0> and bar BL21<0> for the first port. In these memory cells md00 and md10, the other electrode of the NMOS transistor Q11 is electrically connected to the bit line BL21<0> for the first port and the other electrode of the NMOS transistor Q12 is electrically connected to the inverted bit line bar BL21<0> for the first port.

Furthermore, both of the memory cells md00 and md10 are provided between a bit line pair BL22<0> and bar BL22<0> for the second port. In these memory cells md00 and md10, the other electrode of the NMOS transistor Q21 is electrically connected to the bit line BL22<0> for the second port and the other electrode of the NMOS transistor Q22 is electrically connected to the inverted bit line bar BL22<0> for the second port.

Both of the memory cells md01 and md11 on the same column are provided between a bit line pair BL21<1> and bar BL21<1> for the first port. In these memory cells md01 and md11, the other electrode of the NMOS transistor Q11 is electrically connected to the bit line BL21<1> for the first port and the other electrode of the NMOS transistor Q12 is electrically connected to the inverted bit line bar BL21<1> for the first port.

Furthermore, both of the memory cells md01 and md11 are provided between a bit line pair BL22<1> and bar BL22<1> for the second port. In these memory cells md10 and md11, the other electrode of the NMOS transistor Q21 is electrically connected to the bit line BL22<1> for the second port and the other electrode of the NMOS transistor Q22 is electrically connected to the inverted bit line bar BL22<1> for the second port.

Figure 3:
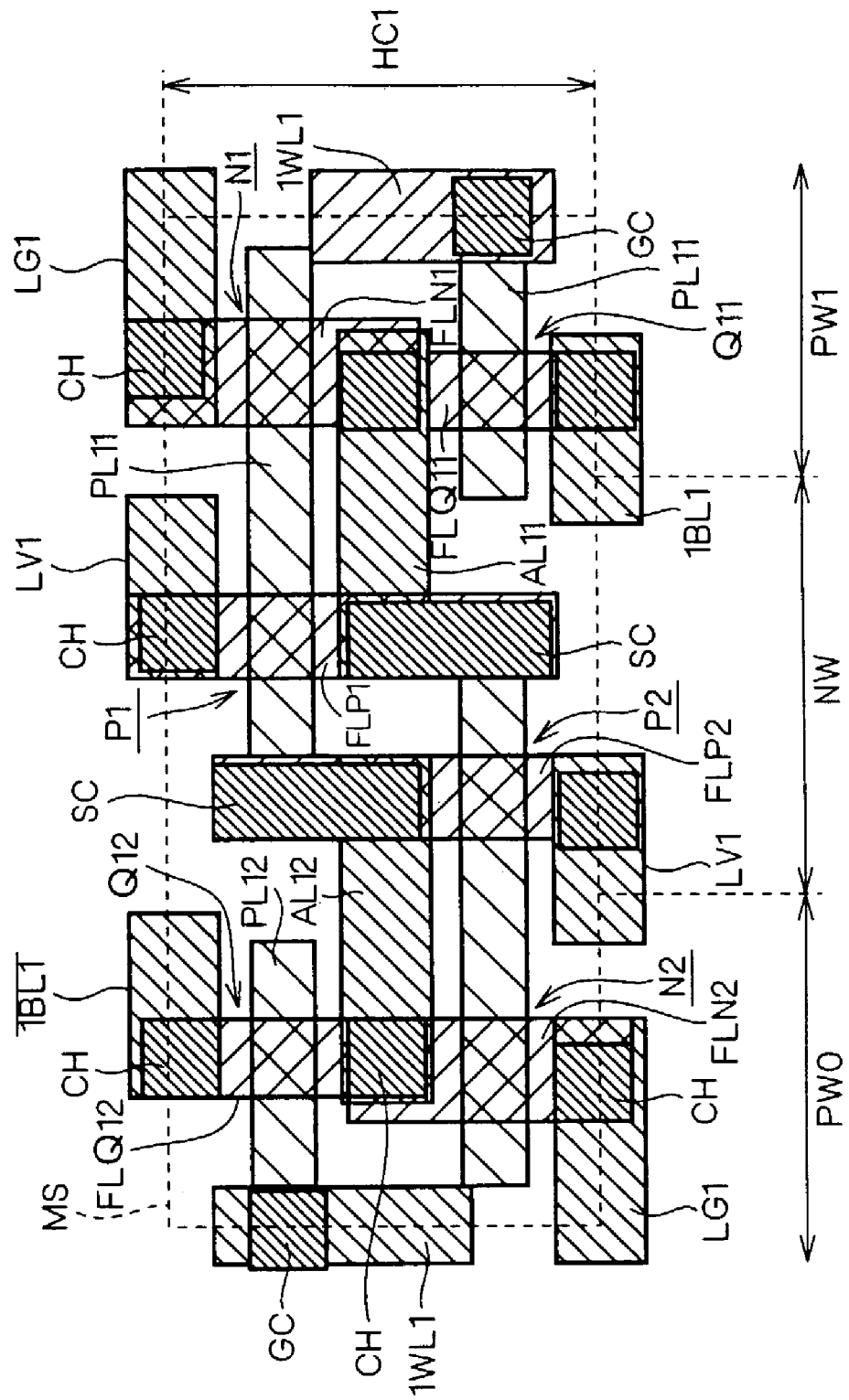
FIG. 3 is an explanatory view showing a layout structure provided under a first aluminum wiring layer in a 1-port memory cell as seen on a plane.

In FIGS. 1 and 2, and FIG. 3 and subsequent drawings, a symbol < > represents a bus signal (line) and a numeral in < > corresponds to a bus signal name. Moreover, <n−1:0> represents a signal having an n-bit width of bus signals 0 to (n−1).

(Operation)

With reference to FIGS. 1 and 2, description will be given to a reading and writing operation using the first port and a reading and writing operation using the second port. For convenience of explanation, a memory cell array structure of the 1-port memory cell array 11 and the 2-port memory cell array 12 is set to be n (rows)×m (columns).

First of all, in the case in which the reading operation of the first port is to be executed, the read control input signal RE1 is enabled. When the read control input signal RE1 is brought into the enable state, the row decoder 16 for receiving a row address corresponding to the address input bus signal AD1 through the control circuit 31 selectively sets, into an active state, a word line WL1<i> (i=0 to n−1) for the first port in word lines WL1<n−1:0> for the first port having n bits.

Consequently, the NMOS transistors Q11 and Q12 of each of selected memory cells msi0 to msim of the 1-port memory cell array 11 connected to the word line WL1<i> for the first port which is set into the active state and selected memory cells mdi0 to mdim of the 2-port memory cell array 12 are turned ON, and contents stored in each of the selected memory cells are propagated to corresponding bit line pairs BL1 and bar BL1, and BL21 and bar BL21 for the first port.

Each of the column selectors 21 and 22 for receiving the column address corresponding to the address input bus signal AD1 through the control circuit 31 selects four sets of bit line pairs from m bit line pairs BL1 and bar BL1, and BL21 and bar BL21 for the first port, and senses and amplifies them by means of an internal sense amplifier. Consequently, the data input/output bus signal DIO11<7:4> and the data input/output bus signal DIO12<3:0> are output as 8-bit read data.

In the case in which the writing operation of the first port is to be executed, next, the write control input signal WE1 is enabled. When the write control input signal WE1 is brought into the enable state, the row decoder 16 for receiving a row address corresponding to the address input bus signal AD1 through the control circuit 31 selectively sets, into an active state, the word line WL1<i> (i=0 to n−1) for the first port in the word lines WL1<n−1:0> for the first port having n bits.

Consequently, the NMOS transistors Q11 and Q12 of each of the selected memory cells msi0 to msim of the 1-port memory cell array 11 and the selected memory cells mdi0 to mdim of the 2-port memory cell array 12 which are connected to the word line WL1<i> for the first port set into the active state are turned ON, and the inverters 41 and 42 of each selected memory cell are electrically connected to the bit line pairs BL1 and bar BL1, and BL21 and bar BL21 for the first port.

At the same time, write data sent from the outside are given as the data input/output bus signal DIO11<7:4> and the data input/output bus signal DIO12<3:0> to/from the column selectors 21 and 22.

Each of the column selectors 21 and 22 for receiving the column address corresponding to the address input bus signal AD1 through the control circuit 31 selects four sets of bit line pairs from m bit line pairs BL1 and bar BL1, and BL21 and bar BL21 for the first port, and gives the write data to the selected bit line pairs, thereby driving the selected bit line pairs to "L" or "H". As a result, it is possible to carry out writing based on the write data for the selected memory cell.

Then, in the case in which the reading operation of the second port is to be executed, the read control input signal RE2 is enabled. When the read control input signal RE2 is brought into the enable state, the row decoder 17 for receiving a row address corresponding to the address input bus signal AD2 through the control circuit 32 selectively sets, into an active state, a word line WL2<i> (i=0 to n−1) for the second port in word lines WL2<n−1:0> for the second port having n bits.

Consequently, the NMOS transistors Q21 and Q22 of each of selected memory cells mdi0 to mdim of the 2-port memory cell array 12 connected to the word line WL2<i> for the second port which is set into the active state are turned ON, and contents stored in each of the selected memory cells are propagated to corresponding bit line pairs BL22 and bar BL22 for the second port.

Subsequently, the column selector 23 for receiving a column address corresponding to the address input bus signal AD2 through the control circuit 32 selects four sets of bit line pairs from m bit line pairs BL22 and bar BL22 for the second port respectively, and senses and amplifies them by means of an internal sense amplifier. Consequently, the data input/output bus signal DIO2<3:0> are output as 4-bit read data.

In the case in which the writing operation of the second port is to be executed, next, the write control input signal WE2 is enabled. When the write control input signal WE2 is brought into the enable state, the row decoder 17 for receiving a row address corresponding to the address input bus signal AD2 through the control circuit 32 selectively sets, into an active state, the word line WL2<i> for the second port in the word lines WL2<n−1:0> for the second port having n bits.

Consequently, the NMOS transistors Q21 and Q22 of each of the selected memory cells mdi0 to mdim of the 2-port memory cell array 12 connected to the word line WL2<i> for the second port which is set into the active state are turned ON, and the inverters 41 and 42 of each selected memory cell are electrically connected to the bit line pair BL22 and bar BL22 for the second port.

At the same time, write data sent from the outside are given as the data input/output bus signal DIO2<3:0> to/from the column selector 23.

The column selector 23 for receiving a column address corresponding to the address input bus signal AD2 through the control circuit 32 selects four sets of bit line pairs from m bit line pairs BL22 and bar BL22 for the second port, and gives the write data to the selected bit line pairs, thereby driving the selected bit line pairs to "L" or "H". As a result, it is possible to carry out writing based on the write data for a selected memory cell.

As described above, it is possible to read and write 8-bit data which are divided and held in high and low orders on a 4-bit unit in the 1-port memory cell array 11 and the 2-port memory cell array 12 from the first port.

Then, it is possible to read and write the lower 4-bit data which are held in the 2-port memory cell array 12 from the second port. In this case, the upper 4-bit data are not accessed at all.

As a result, the semiconductor storage according to the first embodiment can divide, on a 4-bit unit, data to be accessed on an 8-bit length unit and can access data on a lower 4-bit unit thus obtained by the division. The lower 4-bit is accessible from the first and second ports so that it is possible to carry out reading and writing to meet a demand for a data dividing access.

In the first embodiment, thus, the 1-port memory cell array 11 and the 2-port memory cell array 12 including memory cells having different circuit structures from each other can be controlled simultaneously by the row decoder 16. Therefore, it is possible to obtain a semiconductor storage having a 1-chip structure in which a single port memory cell and a 2-port memory cell having different structures can be accessed simultaneously.

Even if the 1-port memory cell array 11 is constituted with a replacement by a 2-port memory cell, moreover, an equivalent operation to that of the first embodiment can be carried out. As compared with this case, an area can be decreased because the upper 4 bits are constituted by the 1-port memory cell, and a layout area can be decreased because it is possible to eliminate a control circuit, a column selector and the like for the upper 4 bits which do not need to be accessed in the second port. Since a circuit scale is thus decreased, it is possible to reduce power consumption during an operation and a standby.

(Layout Structure)

Figure 4:
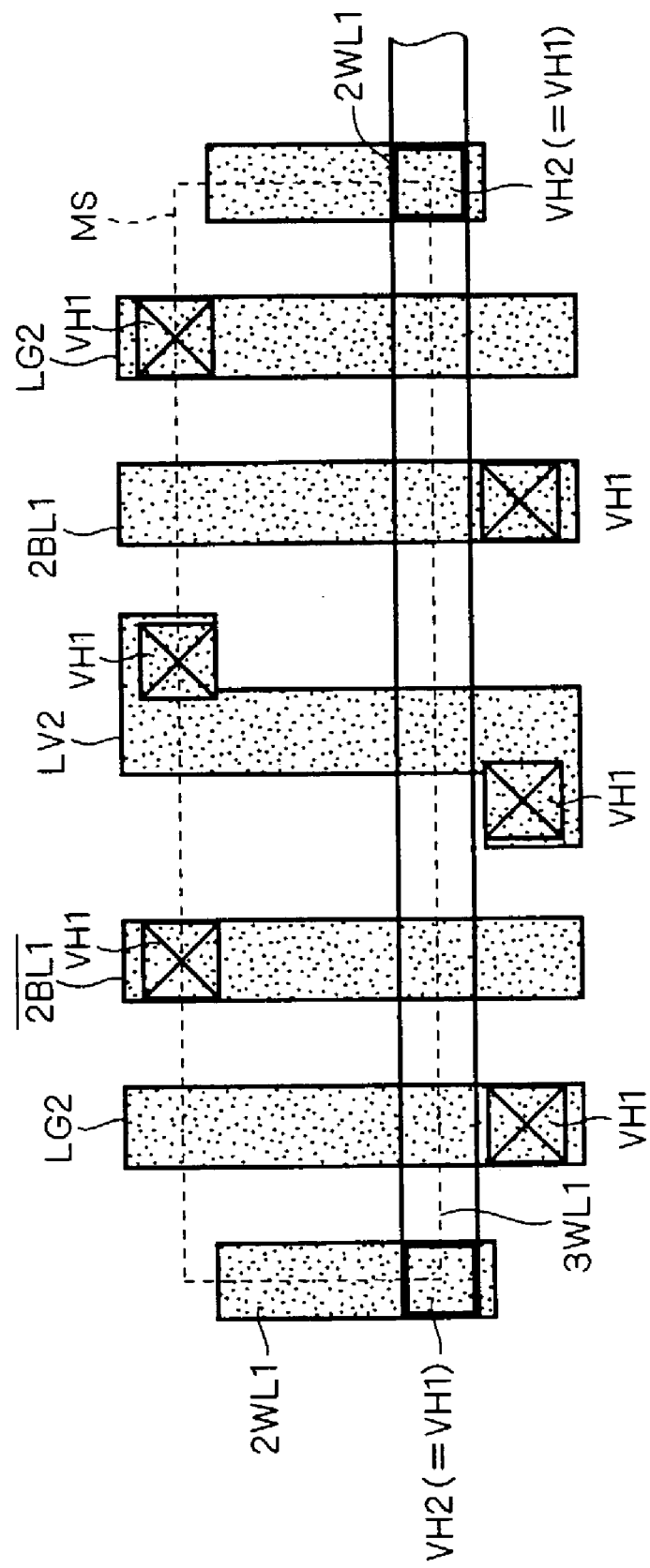
FIG. 4 is an explanatory view showing a layout structure provided above a second aluminum wiring layer in the 1-port memory cell.

FIGS. 3 and 4 are explanatory views showing a layout structure of a single port memory cell MS of the 1-port memory cell array 11. FIG. 3 is an explanatory view mainly showing a layout structure provided under a first aluminum wiring layer as seen on a plane. FIG. 4 is an explanatory view showing a layout structure provided above a second aluminum wiring layer as seen on a plane.

It is assumed that the inverter 41 shown in FIG. 2 is a CMOS inverter constituted by a PMOS transistor P1 and an NMOS transistor N1 and the inverter 42 is a CMOS inverter constituted by a PMOS transistor P2 and an NMOS transistor N2.

As shown in FIG. 3, the PMOS transistors P1 and P2 are formed in an N well region NW, the NMOS transistor N1 and the NMOS transistor Q11 are formed in a P well region PW1, and the NMOS transistor N2 and the NMOS transistor Q12 are formed in a P well region PW0. The P well region PW0 and the P well region PW1 are formed opposite to each other with the N well region NW interposed therebetween.

In the N well region NW, the PMOS transistor P1 is constituted by a polysilicon wiring PL1 provided across a P$^+$ diffusion region FLP1 and the PMOS transistor P2 is constituted by a polysilicon wiring PL2 provided across a P$^+$ diffusion region FLP2.

In the P well region PW1, the NMOS transistor N1 is constituted by the polysilicon wiring PL1 provided across an N$^+$ diffusion region FLN1 and the NMOS transistor Q11 is constituted by a polysilicon wiring PL11 provided across an N$^+$ diffusion region FLQ11. The polysilicon wiring PL1 is formed from the N well region NW to the P well region PW1 and is thus shared as gates of the NMOS transistor N1 and the PMOS transistor P1.

In the P well region PW0, the NMOS transistor N2 is constituted by the polysilicon wiring PL2 provided across an N$^+$ diffusion region FLN2 and the NMOS transistor Q12 is constituted by a polysilicon wiring PL12 provided across an N$^+$ diffusion region FLQ12. The polysilicon wiring PL2 is formed from the N well region NW to the P well region PW0 and is thus shared as gates of the NMOS transistor N2 and the PMOS transistor P2.

Moreover, the polysilicon wiring PL1 and the polysilicon wiring PL12 are formed on the same straight line, the polysilicon wiring PL2 and the polysilicon wiring PL11 are formed on the same straight line, the diffusion regions FLP1, FLN1 and FLQ12 are formed on the same straight line in almost the same form, and the diffusion regions FLP2, FLN2 and FLQ11 are formed on the same straight line in almost the same form.

As a result, the PMOS transistor P1, the NMOS transistor N1 and the NMOS transistor Q12 can be formed along the same straight line and the PMOS transistor P2, the NMOS transistor N2 and the NMOS transistor Q11 can be formed along the same straight line. Consequently, a cell height HC1 of the single port memory cell MS can be set corresponding to two transistors. In this specification, the cell height implies a formation length in a direction of formation of a bit line (a longitudinal direction in the drawing) on the layout structure.

The P$^+$ diffusion regions FLP1 and FLP2 are obtained by implanting and diffusing a P-type impurity and the N$^+$ diffusion regions FLN1, FLN2, FLQ11 and FLQ12 are obtained by implanting and diffusing an N-type impurity. In the description of FIG. 3, each diffusion region has an upper region referred to as one of regions and a lower region referred to as the other region with respect to the polysilicon wiring in FIG. 3.

In the P well region PW1, a ground wiring LG1 (a first layer aluminum wiring) provided on one of the regions of the N$^+$ diffusion region FLN1 is electrically connected to the diffusion region FLN1 through a diffusion contact hole CH. The polysilicon wiring PL11 is electrically connected to a word line 1WL1 (the first layer aluminum wiring) through a gate contact hole GC, and a bit line 1BL1 (the first layer aluminum wiring) provided on the other region of the diffusion region FLQ11 is electrically connected to the other region of the diffusion region FLQ11 through the diffusion contact hole CH.

The diffusion contract hole CH implies a contact hole of the diffusion region and the first layer (aluminum) wiring, and the gate contact hole GC implies a contact hole of the polysilicon wiring and the first layer wiring.

In the N well region NW, a power wiring LV1 (a first layer aluminum wiring) provided on one of the regions of the diffusion region FLP1 is electrically connected to one of the regions of the diffusion region FLP1 through a diffusion contact hole CH, and the power wiring LV1 provided on the other region of the diffusion region FLP2 is electrically connected to the other region of the diffusion region FLP2 through the diffusion contact hole CH.

In the P well region PW0, the inverted bit line bar BL1 (a first layer aluminum wiring) provided on one of the regions of the diffusion region FLQ12 is electrically connected to one of the regions of the diffusion region FLQ1 through a diffusion contact hole CH, and the word line 1WL1 provided on the polysilicon wiring PL12 is electrically connected to the polysilicon wiring PL12 through a gate contact hole GC. A ground wiring LG1 provided on the other region of the diffusion region FLN2 is electrically connected to the other region of the diffusion region FLN2 through a contact hole CH.

The aluminum wiring AL11 to be the first layer aluminum wiring extended from the other region of the diffusion region FLN1 to the other region of the P$^+$ diffusion region FLP1 is electrically connected to one of the regions of the diffusion region FLN1 through the diffusion contact hole CH. The aluminum wiring AL11 is electrically connected to the other region of the P$^+$ diffusion region FLP1 and the polysilicon wiring PL2 through a shared contact SC formed from the other region of the P$^+$ diffusion region FLP1 to the polysilicon wiring PL2.

The aluminum wiring AL12 to be the first layer aluminum wiring extended from one of the regions of the diffusion region FLN2 to one of the regions of the P$^+$ diffusion region FLP2 is electrically connected to one of the regions of the diffusion region FLN2 through the diffusion contact hole CH. The aluminum wiring AL12 is electrically connected to one of the regions of the P$^+$ diffusion region FLP2 and the polysilicon wiring PL1 through the shared contact SC formed from one of the regions of the P$^+$ diffusion region FLP2 to the polysilicon, wiring PL1.

As shown in FIG. 4, a ground wiring LG2 (a second layer aluminum wiring) is electrically connected to the lower ground wiring LG1 (not shown) through a via hole VH1. A power wiring LV2 (the second layer aluminum wiring) is electrically connected to the lower power wiring LV1 (not shown) through the via hole VH1.

A word line 2WL1 (the second layer aluminum wiring) is electrically connected to the word line 1WL1 (not shown) through the via hole VH1, and a word line 3WL1 (a third layer aluminum wiring) is electrically connected to the word line 2WL1 through a via hole VH2. These word lines 1WL1 to 3WL1 constitute the word line WL1 for the first port in FIGS. 1 and 2.

The word line 3WL1 is formed across the P well regions PW0 and PW1 and the N well region NW. The via hole VH1 implies a via hole for connecting the first layer wiring to the second layer (aluminum) wiring, and the via hole VH2 implies a via hole for connecting the second layer wiring to the third layer (aluminum) wiring.

The bit line 2BL1 (the second layer aluminum wiring) is electrically connected to the lower bit line 1BL1 (not shown) through the via hole VH1 and the inverted bit line bar 2BL1 (the second layer aluminum wiring) is electrically connected to the lower inverted bit line bar 1BL1 (not shown) through the via hole VH1.

The bit line pair BL1 and bar BL1 for the first port in FIGS. 1 and 2 are constituted by the bit line 2BL1, the bit line 1BL1 and the inverted bit lines bar 2BL1 and bar 1BL1.

The bit lines 2BL1 and bar 2BL1, the ground wiring LG2 and the power wiring LV2 are formed in parallel with each other in a longitudinal direction of FIG. 4 over the P well regions PW1 and PW0 and the N well region NW, respectively.

Figure 5:
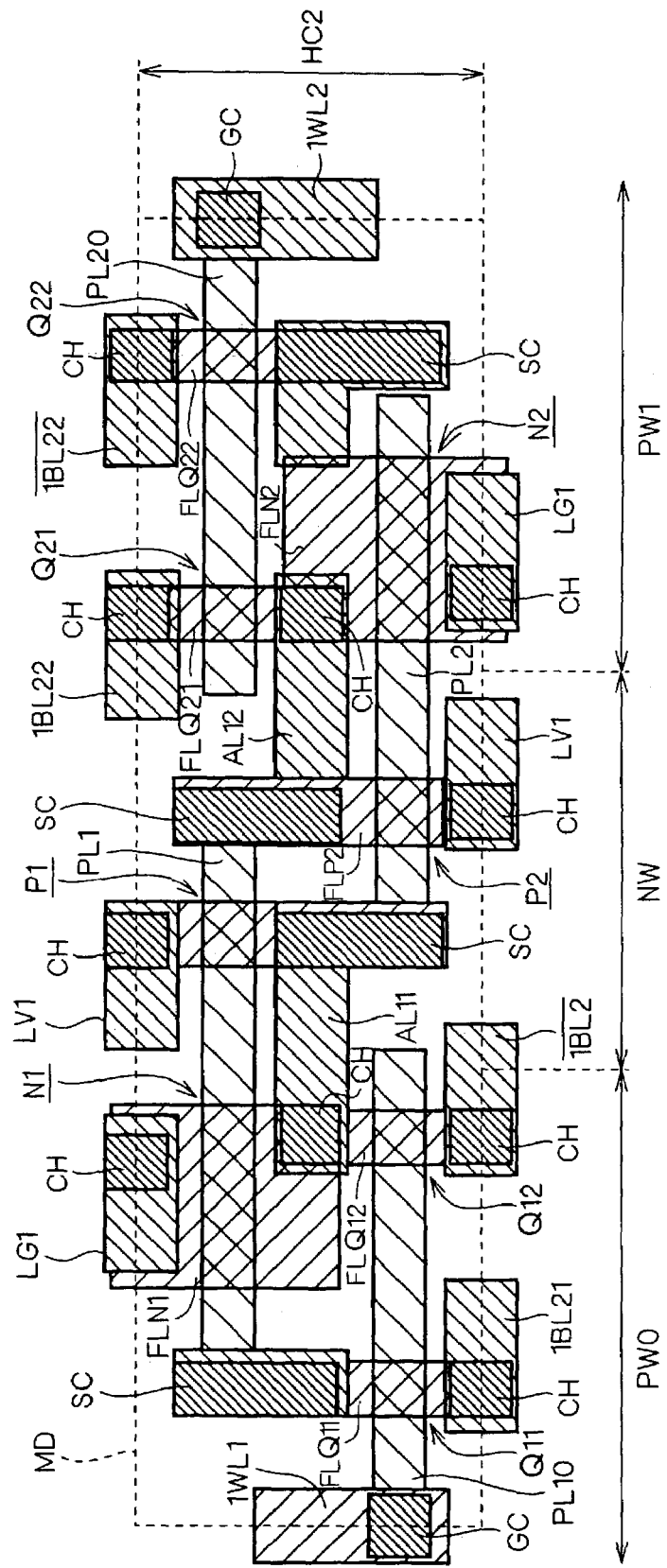
FIG. 5 is an explanatory view showing a layout structure provided under a first aluminum wiring layer in a 2-port memory cell as seen on a plane.
Figure 6:
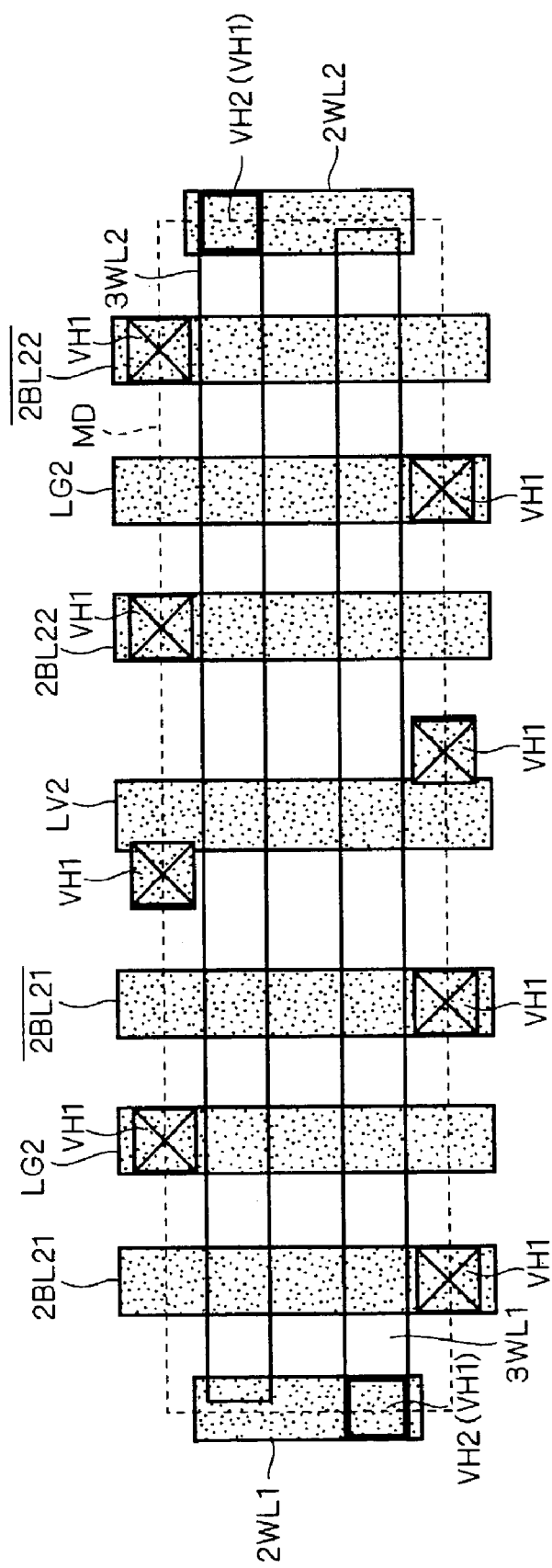
FIG. 6 is an explanatory view showing a layout structure provided above the second aluminum wiring layer in the 2-port memory cell.

FIGS. 5 and 6 are explanatory views showing a layout structure of a 2-port memory cell MD of the 2-port memory cell array 12. FIG. 5 is an explanatory view mainly showing a layout structure provided under the first aluminum wiring layer as seen on a plane. FIG. 6 is an explanatory view showing a layout structure provided above the second aluminum wiring layer as seen on a plane.

It is assumed that the inverter 41 shown in FIG. 2 is a CMOS inverter constituted by a PMOS transistor P1 and an NMOS transistor N1 and the inverter 42 is a CMOS inverter constituted by a PMOS transistor P2 and an NMOS transistor N2.

As shown in FIG. 5, the PMOS transistors P1 and P2 are formed in the N well region NW, the NMOS transistor N1 and the NMOS transistors Q21 and Q22 are formed in the P well region PW1, and the NMOS transistor N2 and the NMOS transistors Q11 and Q12 are formed in the P well region PW0. The P well region PW0 and the P well region PW1 are formed opposite to each other with the N well region NW interposed therebetween.

In the N well region NW, the PMOS transistor P1 is constituted by a polysilicon wiring PL1 provided across a P$^+$ diffusion region FLP1 and the PMOS transistor P2 is constituted by a polysilicon wiring PL2 provided across a P$^+$ diffusion region FLP2.

In the P well region PW0, the NMOS transistor N1 is constituted by the polysilicon wiring PL1 provided across an N$^+$ diffusion region FLN1 and the NMOS transistors Q11 and Q12 are constituted by a polysilicon wiring PL10 provided across N$^+$ diffusion regions FLQ11 and FLQ12. The polysilicon wiring PL1 is formed from the N well region NW to the P well region PW1 and is thus shared as gates of the NMOS transistor N1 and the PMOS transistor P1, and the polysilicon wiring PL10 is shared as gates of the NMOS transistors Q11 and Q12.

In the P well region PW1, the NMOS transistor N2 is constituted by the polysilicon wiring PL2 provided across an N$^+$ diffusion region FLN2 and the NMOS transistors Q21 and Q22 are constituted by a polysilicon wiring PL20 provided across N$^+$ diffusion regions FLQ21 and FLQ22, respectively. The polysilicon wiring PL2 is formed from the N well region NW to the P well region PW0 and is thus shared as gates of the NMOS transistor N2 and the PMOS transistor P2, and the polysilicon wiring PL20 is shared as gates of the NMOS transistors Q21 and Q22.

Moreover, the polysilicon wiring PL1 and the polysilicon wiring PL20 are formed on the same straight line, the polysilicon wiring PL2 and the polysilicon wiring PL10 are formed on the same straight line, the diffusion regions FLP1, FLN1, FLQ21 and FLQ22 are formed on the same straight line, and the diffusion regions FLP2, FLN2, FLQ11 and FLQ12 are formed on the same straight line.

As a result, the PMOS transistor P1 and the NMOS transistors N1, Q21 and Q22 can be formed along the same straight line and the PMOS transistor P2 and the NMOS transistors N2, Q11 and Q12 can be formed along the same straight line. Consequently, a cell height HC2 of the 2-port memory cell MD can be set corresponding to two transistors in the same manner as the single port memory cell MS (HC2=HC1).

The P+ diffusion regions FLP1 and FLP2 are obtained by implanting and diffusing a P-type impurity and the N+ diffusion regions FLN1, FLN2, FLQ11, FLQ12, FLQ21 and FLQ22 are obtained by implanting and diffusing an N-type impurity. In the description of FIG. 5, each diffusion region has an upper region referred to as one of regions and a lower region referred to as the other region with respect to the polysilicon wiring in FIG. 5.

In the P well region PW0, a ground wiring LG1 provided on one of the regions of the N+ diffusion region FLN1 is electrically connected to one of the regions of the diffusion region FLN1 through a diffusion contact hole CH. The polysilicon wiring PL10 is electrically connected to a word line 1WL1 through a gate contact hole GC, and a bit line 1BL21 (the first layer aluminum wiring) provided on the other region of the diffusion region FLQ11 is electrically connected to the other region of the diffusion region FLQ11 through the diffusion contact hole CH, and the inverted bit line bar 1BL21 (the first layer aluminum wiring) provided on the other region of the diffusion region FLQ12 is electrically connected to the other region of the diffusion region FLQ12 through the diffusion contact hole CH.

Furthermore, the polysilicon wiring PL1 and one of the regions of the N+ diffusion region FLQ12 are electrically connected to each other through the shared contact SC formed from one of the regions of the N+ diffusion region FLQ11 to the polysilicon wiring PL1.

In the N well region NW, a power wiring LV1 provided on one of the regions of the diffusion region FLP1 is electrically connected to one of the regions of the diffusion region FLP1 through the diffusion contact hole CH, and the power wiring LV1 provided on the other region of the diffusion region FLP2 is electrically connected to the other region of the diffusion region FLP2 through the diffusion contact hole CH.

In the P well region PW1, the bit line 1BL22 (the first layer aluminum wiring) provided on one of the regions of the diffusion region FLQ21 is electrically connected to one of the regions of the diffusion region FLQ21 through the diffusion contact hole CH, and the inverted bit line bar 1BL22 (the first layer aluminum wiring) provided on one of the regions of the diffusion region FLQ22 is electrically connected to one of the regions of the diffusion region FLQ22 through the diffusion contact hole CH.

The word line 1WL2 (the first layer aluminum wiring) provided on the polysilicon wiring PL20 is electrically connected to the polysilicon wiring PL20 through the gate contact hole GC, and the ground wiring LG1 provided on the other region of the diffusion region FLN2 is electrically connected to the other region of the diffusion region FLN2 through the diffusion contact hole CH.

The aluminum wiring AL11 to be the first layer aluminum wiring extended from the other region of the diffusion region FLN1 to the other region of the P+ diffusion region FLP1 is electrically connected to one of the regions of the diffusion region FLN1 through the diffusion contact hole CH. The aluminum wiring AL11 is electrically connected to the other region of the P+ diffusion region FLP1 and the polysilicon wiring PL2 through a shared contact SC formed from the other region of the P+ diffusion region FLP1 to the polysilicon wiring PL2.

The aluminum wiring AL12 to be the first layer aluminum wiring extended from one of the regions of the diffusion region FLN2 to one of the regions of the P+ diffusion region FLP2 is electrically connected to one of the regions of the diffusion region FLN2 through the diffusion contact hole CH. The aluminum wiring AL12 is electrically connected to one of the regions of the P+ diffusion region FLP2 and the polysilicon wiring PL1 through the shared contact SC formed from one of the regions of the P+ diffusion region FLP2 to the polysilicon wiring PL1.

As shown in FIG. 6, a ground wiring LG2 is electrically connected to the lower ground wiring LG1 (not shown) through a via hole VH1. A power wiring LV2 is electrically connected to the lower power wiring LV1 (not shown) through the via hole VH1.

A word line 2WL1 is electrically connected to the word line 1WL1 (not shown) through the via hole VH1, and a word line 3WL1 is electrically connected to the word line 2WL1 through a via hole VH2. These word lines 1WL1 to 3WL1 constitute the word line WL1 for the first port in FIGS. 1 and 2.

A word line 2WL2 (the second layer aluminum wiring) is electrically connected to the word line 1WL2 (not shown) through the via hole VH1, and a word line 3WL2 (a third layer aluminum wiring) is electrically connected to the word line 2WL2 through the via hole VH2. These word lines 1WL2 to 3WL2 constitute the word line WL2 for the second port in FIGS. 1 and 2.

The word lines 3WL1 and 3WL2 are formed across the P well regions PW0 and PW1 and the N well region NW.

The bit line 2BL21 (the second layer aluminum wiring) is electrically connected to the lower bit line 1BL21 (not shown) through the via hole VH1 and the inverted bit line bar 2BL21 (the second layer aluminum wiring) is electrically connected to the lower inverted bit line bar 1BL21 (not shown) through the via hole VH1.

The bit line 2BL22 (the second layer aluminum wiring) is electrically connected to the lower bit line 1BL22 (not shown) through the via hole VH1 and the inverted bit line bar 2BL22 (the second layer aluminum wiring) is electrically connected to the lower inverted bit line bar 1BL22 (not shown) through the via hole VH1.

The bit line pair BL21 and bar BL21 for the first port in FIGS. 1 and 2 are constituted by the bit line 2BL21, the bit line 1BL21 and the inverted bit lines bar 2BL21 and bar 1BL21, and the bit line pair BL22 and bar BL22 for the second port in FIGS. 1 and 2 are constituted by the bit line 2BL22, the bit line 1BL22 and the inverted bit lines bar 2BL22 and bar 1BL22.

The bit lines 2BL21 and bar 2BL21, the bit lines 2BL22 and bar 2BL22, and the ground wiring LG2 and the power wiring LV2 are formed in parallel with each other in a longitudinal direction of the drawing over the P well regions PW1 and PW0 and the N well region NW, respectively.

Figure 7:
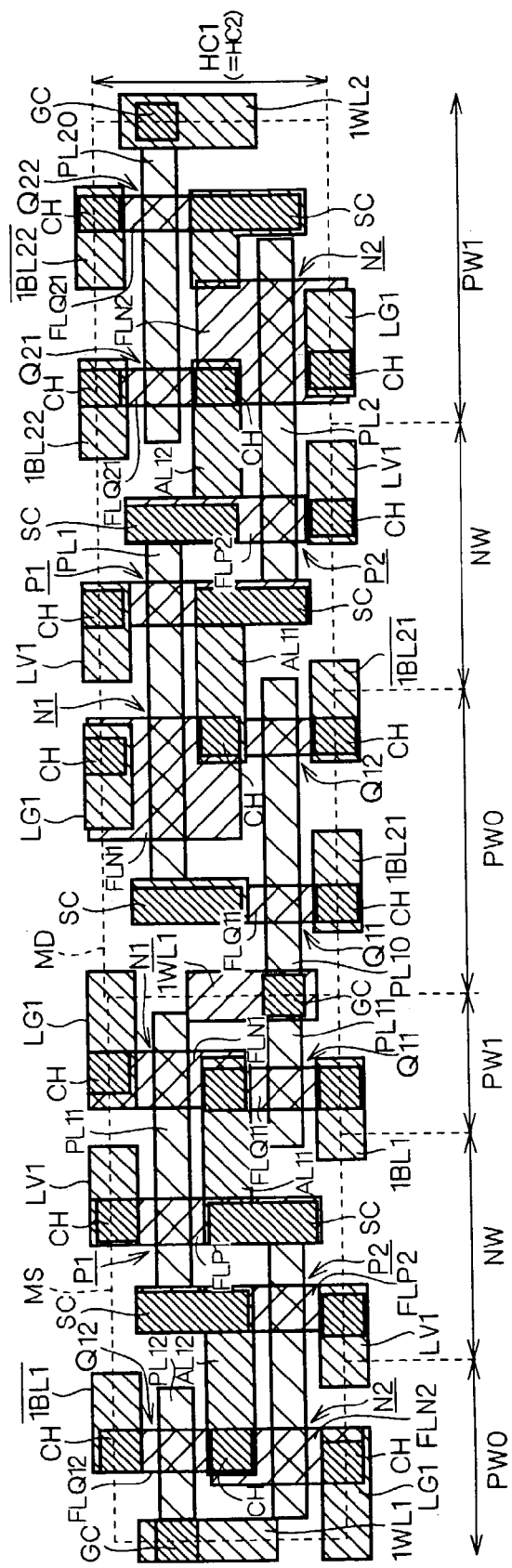
FIG. 7 is an explanatory view showing a layout structure provided under a first aluminum wiring layer in a 1-port and 2-port memory cell as seen on a plane.

FIG. 7 is an explanatory view showing a layout structure of a single port memory cell MS and a 2-port memory cell MD in the vicinity of a boundary between the 1-port memory cell array 11 and the 2-port memory cell array 12. FIG. 7 is an explanatory view mainly showing a layout structure provided under the first aluminum wiring layer as seen on a plane.

As shown in FIG. 7, cell heights of the single port memory cell MS and the 2 port memory cell MD are set to be equal to each other (HC1=HC2) so that the single port memory cell MS and the 2-port memory cell MD can be arranged adjacently without a useless region such as a spacer. In this case, the word line 1WL1, the gate contact hole GC and the via hole VH1 (not shown) provided on a boundary line 39 are shared as shown in FIG. 7.

<Second Embodiment>

Figure 8:
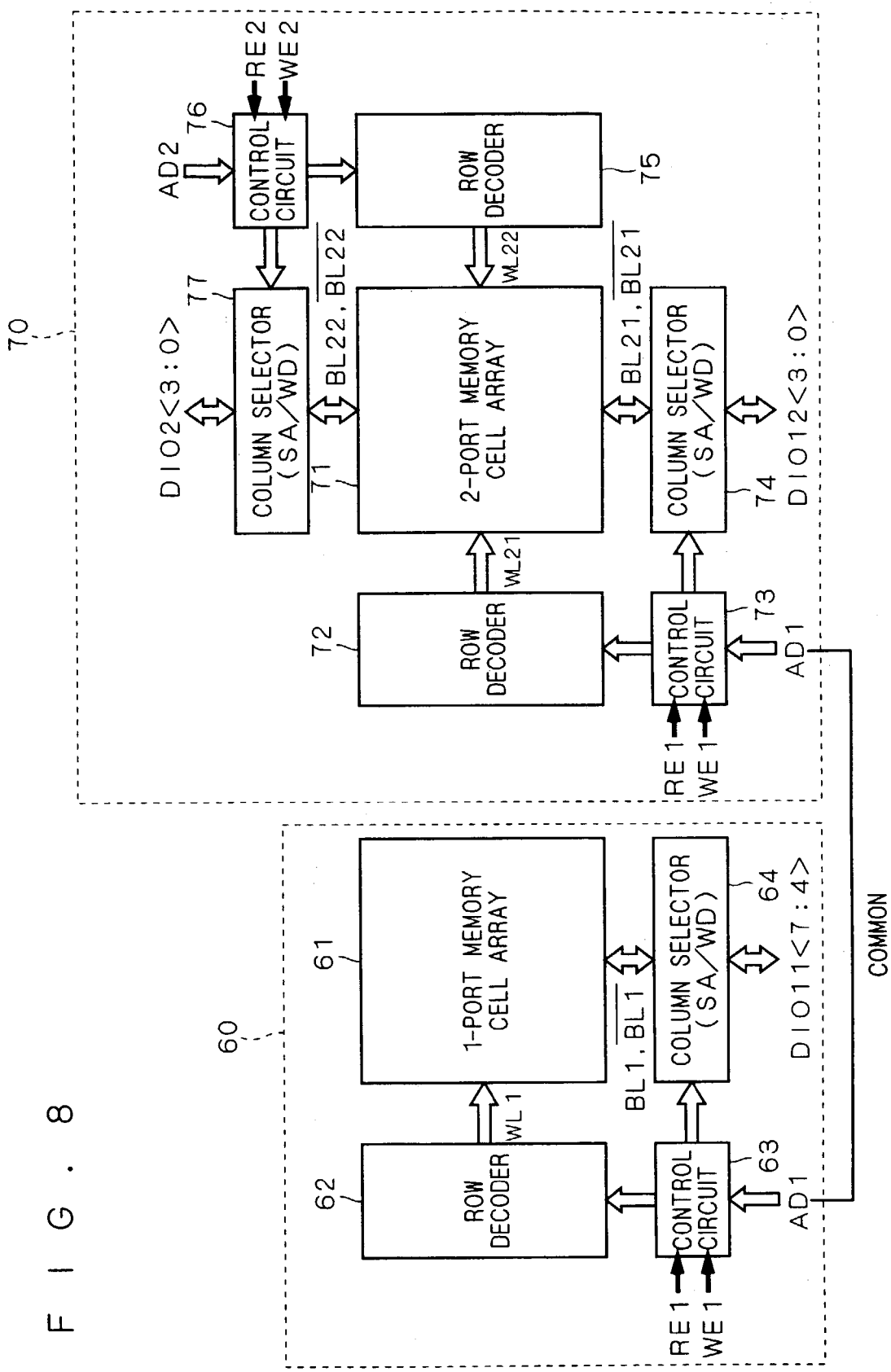
FIG. 8 is a block diagram showing a structure of a semiconductor storage according to a second embodiment of the present invention.

FIG. 8 is a block diagram showing a structure of a semiconductor storage according to a second embodiment of the present invention. For the semiconductor storage according to the second embodiment, a 1-chip semiconductor storage is implemented by using a memory macro 60 (a first memory cell array) having a 1-port memory cell structure and a memory macro 70 (a second memory cell array) having a 2-port memory cell structure.

As shown in FIG. 8, the semiconductor storage is implemented by a combination of the memory macros 60 and 70 provided independently. The memory macro 60 is constituted by a 1-port memory cell array 61, a row decoder 62, a control circuit 63 and a column selector 64. The 1-port memory cell array 61 is provided With a word line WL1 for a first port (a first word line), and the 2-port memory cell array 71 is provided with a word line WL21 for the first port (a second word line) and a word line WL22 for the second port (a third word line).

Upon receipt of an address input bus signal AD1, a control circuit 63 supplies a row address to a row decoder 62 and a column address to a column selector 64 under timing control of a read control input signal RE1 and a write control input signal WE1. The row decoder 62 (a first row decoder (No. 1)) selectively sets any of the plurality of the word lines WL1 for the first port into an active state based on the row address.

The column selector 64 selects a portion equivalent to 4 bits from a plurality of bit line pairs BL1 and bar BL1 for the first port based on the column address sent from the control circuit 63 and inputs/outputs a data input/output bus signal DIO11<7:4> to/from the 1-port memory cell array 61 through the bit line pair BL1 and bar BL1 for the first port thus selected.

On the other hand, the memory macro 70 is constituted by a 2-port memory cell array 71, a peripheral circuit for the first port (a row decoder 72 (a first row decoder (No. 2)), a control circuit 73 and a column selector 74), and a peripheral circuit for the second port (a row decoder 75 (a second row decoder), a control circuit 76 and a column selector 77).

Upon receipt of an address input bus signal AD1, a control circuit 73 supplies a row address to a row decoder 72 and a column address to a column selector 74 under timing control of the read control input signal RE1 and the write control input signal WE1. The row decoder 72 selectively sets any of a plurality of the word lines WL21 for the first port into an active state based on the row address.

The column selector 74 selects a portion equivalent to 4 bits from a plurality of bit line pairs BL21 and bar BL21 for the first port based on the column address sent from the control circuit 73 and inputs/outputs a data input/output bus signal DIO11<3:0> to/from the 2-port memory cell array 71 through the bit line pairs BL21 and bar BL21 for the first port thus selected.

Upon receipt of an address input bus signal AD2, a control circuit 76 supplies a row address to a row decoder 75 and a column address to a column selector 77 under timing control of a read control input signal RE2 and a write control input signal WE2. The row decoder 75 selectively sets any of a plurality of the word lines WL22 for the second port into an active state based on the row address.

The column selector 77 selects a portion equivalent to 4 bits from a plurality of bit line pairs BL22 and bar BL22 for the second port based on the column address sent from the control circuit 76 and inputs/outputs a data input/output bus signal DIO2<3:0 > to/from the 2-port memory cell array 71 through the bit line pairs BL22 and bar BL22 for the second port thus selected.

These column selectors 64, 74 and 77 have a sense amplifier function and a write driving function.

An operation of the semiconductor storage according to the second embodiment is carried out basically in the same manner as that of the semiconductor storage according to the first embodiment except that simultaneous control of the 1-port memory cell array 11 and the 2-port memory cell array 12 by the row decoder 16 according to the first embodiment is replaced with simultaneous control of the 1-port memory cell array 61 and the 2-port memory cell array 71 by the two row decoders 62 and 72.

In the semiconductor storage according to the second embodiment, accordingly, it is possible to read and write 8-bit data which are divided and held in high and low orders on a 4-bit unit in the 1-port memory cell array 61 and the 2-port memory cell array 71 from the first port based on the address input bus signal AD1.

Then, it is possible to read and write lower 4-bit data which are held in the 2-port memory cell array 71 from the second port based on the address input bus signal AD2. In this case, the upper 4-bit data are not accessed at all.

As a result, the semiconductor storage according to the second embodiment can divide, on a 4-bit unit, data to be accessed on an 8-bit length unit and can access data on a lower 4-bit unit thus obtained by the division. The lower 4 bits are accessible from the first and second ports so that it is possible to carry out reading and writing to meet a demand for a data dividing access.

In the second embodiment, thus, the memory macro 60 and the memory macro 70 are combined and the 1-port memory cell array 61 and the 2-port memory cell array 71 which have different port structures can be simultaneously controlled by the row decoders 62 and 63 based on the same address input bus signal AD1, respectively. Consequently, it is possible to obtain a semiconductor storage having a 1-chip structure in which the 1-port memory cell array 61 and the 2-port memory cell array 71 can be accessed at the same time.

As compared with the semiconductor storage according to the first embodiment, the semiconductor storage according to the second embodiment can produce an effect that the word lines WL1 and WL21 for the first port of the 1-port memory cell array 61 and the 2-port memory cell array 71 are individually driven by the row decoders 62 and 72 so that a signal propagation delay can be prevented from being increased due to a resistance component of the word line.

Furthermore, there can be produced an effect that a distance from the row decoders 62 and 72 according to the second embodiment to memory cells provided in the most distant positions of the 1-port memory cell array 61 and the 2-port memory cell array 71 can be set to be shorter than a distance from the row decoder 16 according to the first embodiment to a memory cell provided in the most distant position, resulting in prevention of an increase in the signal propagation delay due to the resistance component of the word line.

On the other hand, in the structure according to the first embodiment shown in FIG. 1, the number of the row decoders and the control circuits can be reduced by one as compared with the structure shown in FIG. 8 (both of the numbers is two in FIG. 1 and both of the numbers is three in FIG. 8). Thus, the degree of integration can be more enhanced.

<Third Embodiment>

Figure 9:
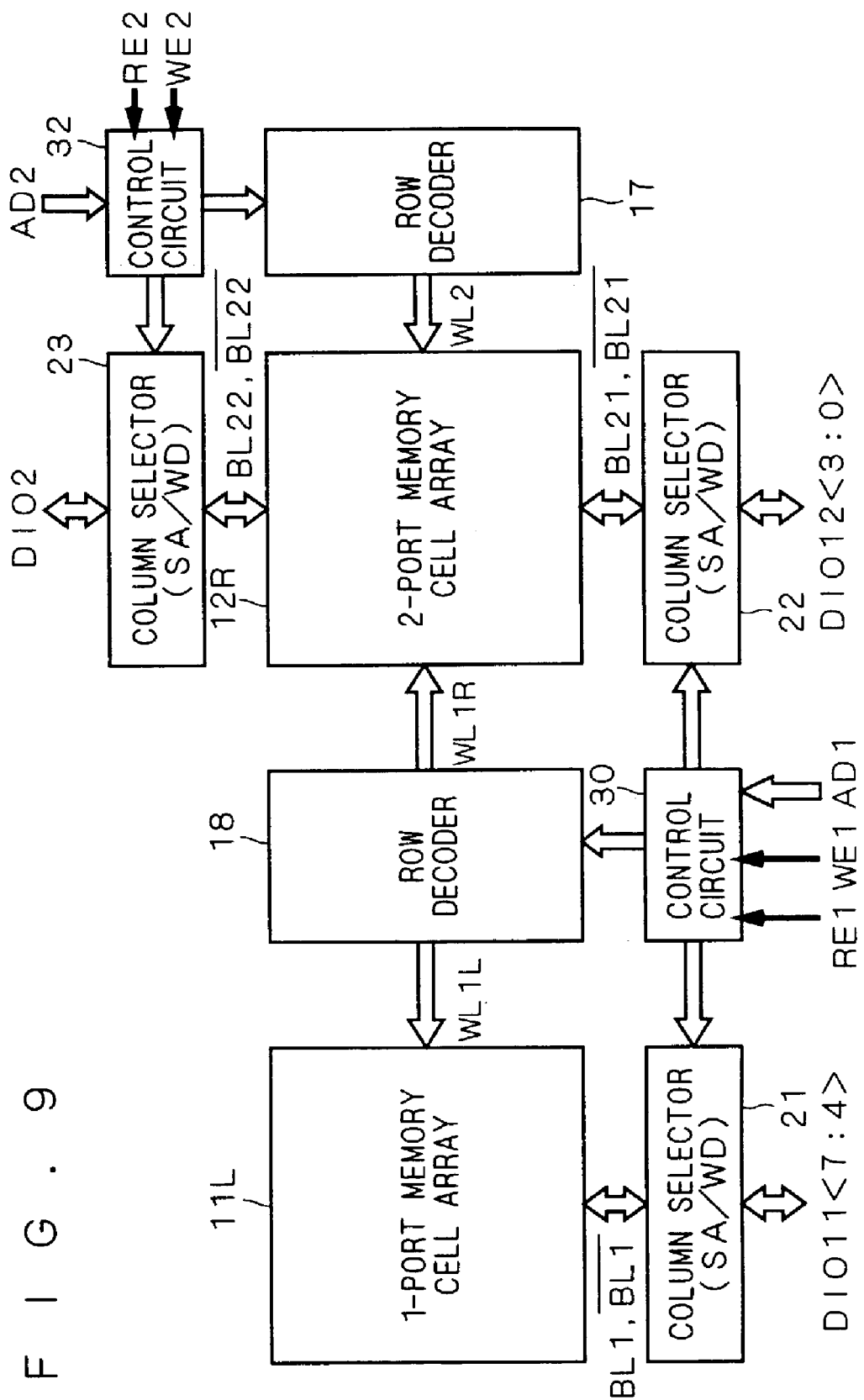
FIG. 9 is a block diagram showing a structure of a semiconductor storage according to a third embodiment of the present invention.

FIG. 9 is a block diagram showing a structure of a semiconductor storage according to a third embodiment of the present invention.

As shown in FIG. 9, a 1-port memory cell array 11L (a first memory cell array) and a 2-port memory cell array 12R (a second memory cell array) are provided together over one chip with a row decoder 18 (a first row decoder) interposed therebetween, thereby constituting a memory macro. The 1-port memory cell array 11L is provided with a word line WL1L for a first port (a first word line) and the 2-port memory cell array 12R is provided with a word line WL1R for the first port (a second word line) and a word line WL2 for the second port (a third word line).

The row decoder 18 drives the word lines WL1L and WL1R for the first port in such a manner that the same row is set into an active state in common. Other structures are the same as those in the first embodiment shown in FIG. 1.

In the third embodiment, thus, the control for setting, into an active state, the word lines WL1L and WL1R for the first port which are provided in the 1-port memory cell array 11L and the 2-port memory cell array 12R is carried out in common on a row unit by the row decoder 18 arranged between the 1-port memory cell array 11L and the 2-port memory cell array 12R.

FIG. 10 is an explanatory diagram showing an internal structure of the row decoder 18 in FIG. 9. As shown in FIG. 10, the row decoder 18 has a decode circuit 18a and selectively sets, into an "H" level, any of output lines OL<0> to OL<n−1> sent from a final stage logic gate group 65 based on an address input bus signal AD1 obtained through a control circuit 30.

The output lines OL<0> to OL<n−1> are connected to input sections of drivers DRL<0> to DRL<n−1> and to input sections of drivers DRR<0> to DRR<n−1>. The drivers DRL<0> to DRL<n−1> drive WL1L<0> to WL1L<n−1>, and the drivers DRR<0> to DRR<n−1> drive WL1R<0> to WL1R<n−1>. Accordingly, word lines WL1L<i> and WL1R<i> for the first port on the same row are selected (to have the "H" level) in common through a common output line OL<i>.

The semiconductor storage according to the third embodiment having such a structure further produces the following effects in addition to the effects of the first embodiment.

As compared with the semiconductor storage according to the first embodiment, the semiconductor storage according to the third embodiment can produce a first effect that the word lines WL1L and WL1R for the first port of the 1-port memory cell array 11L and the 2-port memory cell array 12R are driven individually and a signal propagation delay can be correspondingly prevented from being increased due to a resistance component of the word line.

Furthermore, it is possible to produce a second effect that a distance from the row decoder 18 according to the third embodiment to a memory cell provided in the most distant position can be set to be shorter than a distance from the row decoder 16 according to the first embodiment to a memory cell provided in the most distant position, resulting in prevention of an increase in the signal propagation delay due to the resistance component of the word line.

In the third embodiment, the separate word lines WL1L and WL1R for the first port have been provided for the 1-port memory cell array 11L and the 2-port memory cell array 12R. Also with such a structure that one word line WL1 for the first port is provided on a row unit as a common word line to be shared by the 1-port memory cell array 11L and the 2-port memory cell array 12R and is driven by a common driver in the same manner as in the first embodiment, it is possible to produce the second effect that the signal propagation delay can be prevented from being increased due to the resistance component of the word line.

<Fourth Embodiment>

(Whole Structure)

FIG. 11 is a block diagram showing a structure of a semiconductor storage according to a fourth embodiment of the present invention.

As shown in FIG. 11, a 1-port memory cell array 11 and a CAM (Content Addressable Memory) cell array 13 (a second memory cell array) are provided together over one chip to constitute a memory macro. More specifically, the 1-port memory cell array 11 is provided with a word line WL1 for a first port (a first word line (a common word line)) and the CAM cell array 13 is provided with a word line WL1 for a first port (a second word line (a common word line)) and a match line ML (a third word line) to be a second port.

Since a row decoder 16, a control circuit 31 and column selectors 21 and 22 are the same as those in the first embodiment shown in FIG. 1, description will be omitted.

A control circuit 33 controls operations of a driver circuit 26 and a coincidence detecting circuit 27 under timing control of an add comparison control input signal ME.

The driver circuit 26 inputs a data input signal DI2<m−1:0> corresponding to m search line pairs SL and bar SL, that is, expectation data for one row to the CAM cell array 13 at time of data comparison and retrieval under the control of the control circuit 33.

The coincidence detecting circuit 27 outputs match output data MO and hit output data BO based on signal values of a plurality of match lines ML in the CAM cell array 13 at time of data comparison and retrieval under the control of the control circuit 33.

(Memory Cell Structure)

Figure 12:
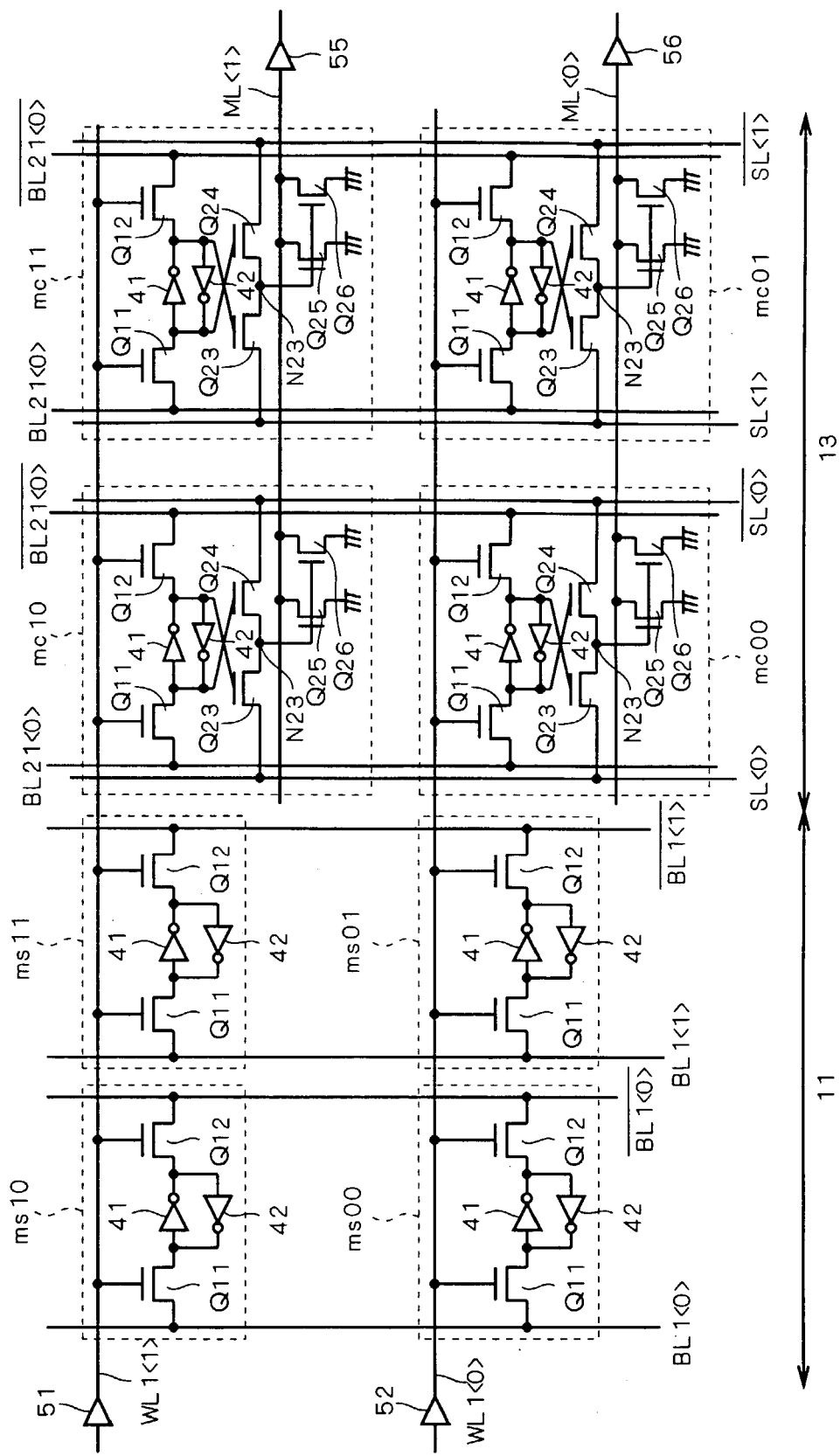
FIG. 12 is a circuit diagram showing a memory cell array structure according to the fourth embodiment.

FIG. 12 is a circuit diagram showing a memory cell array structure of the 1-port memory cell array 11 and the CAM cell array 13. For convenience of explanation, FIG. 12 shows only a memory cell having a 2×2 structure but does not imply an actual size of the memory cell array (a matrix-like memory cell arrangement).

Since the 1-port memory cell array 11 is the same as the structure of the first embodiment shown in FIG. 2, description will be omitted.

On the other hand, the CAM cell array 13 is constituted by memory cells mc00, mc01, mc10 and mc11.

Each of the memory cells mc00 to mc11 is constituted by inverters 41 and 42 which are cross connected to each other, an NMOS transistor Q11 having one of electrodes connected to an input of the inverter 41, an NMOS transistor Q12 having one of electrodes connected to an input of the inverter 42, and NMOS transistors Q23 to Q26.

The NMOS transistors Q23 and Q24 having gate electrodes connected to the inputs of the inverters 42 and 41 respectively have mutual electrodes connected to each other at a node N23, and one of electrodes of each of the NMOS transistors Q25 and Q26 to which a gate electrode of the node N23 is connected in common is grounded.

In the memory cells mc00 and mc01 on the same row, gate electrodes of the NMOS transistors Q11 and Q12 are electrically connected to a word line WL1<0> for the first port in common, and the other electrodes of the NMOS transistors Q25 and Q26 are connected to a match line ML<0> in common.

In the memory cells mc10 and mc11 on the same row, gate electrodes of the NMOS transistors Q11 and Q12 are electrically connected to a word line WL1<1> for the first port in common, and the other electrodes of the NMOS transistors Q25 and Q26 are electrically connected to a match line ML<1> in common.

Both of the memory cells mc00 and mc10 on the same column are provided between a bit line pair BL21<0> and bar BL21<0> for the first port. In these memory cells mc00 and mc10, the other electrode of the NMOS transistor Q11 is electrically connected to the bit line BL21<0> for the first port and the other electrode of the NMOS transistor Q12 is electrically connected to the inverted bit line bar BL21<0> for the first port.

Furthermore, both of the memory cells mc00 and mc10 are provided between a search line pair SL<0> and bar SL<0>. In these memory cells mc00 and mc10, the other electrode of the NMOS transistor Q23 is electrically connected to the search line SL<0> and the other electrode of the NMOS transistor Q24 is electrically connected to the inverted search line bar SL<0>.

Both of the memory cells mc01 and mc11 on the same column are provided between a bit line pair BL21<1> and bar BL21<1> for the first port. In these memory cells mc01 and mc11, the other electrode of the NMOS transistor Q11 is electrically connected to the bit line BL21<1> for the first port and the other electrode of the NMOS transistor Q12 is electrically connected to the inverted bit line bar BL21<1> for the first port.

Furthermore, both of the memory cells mc01 and mc11 are provided between a search line pair SL<1> and bar SL<1>. In these memory cells mc01 and mc11, the other electrode of the NMOS transistor Q23 is electrically connected to the search line SL<1> and the other electrode of the NMOS transistor Q24 is electrically connected to an inverted search line bar SL<2>.

The match lines ML<0> and ML<1> are amplified by drivers 56 and 55 (which are usually provided in the coincidence detecting circuit 27 (not shown)), respectively.

(Operation)

With reference to FIGS. 11 and 12, an operation for comparing and retrieving data through the second port will be described below. Since reading and writing operations using the first port are the same as those in the first embodiment except that a 2-port memory cell array 12 is replaced with the CAM cell array 13, description will be omitted.

The operation for comparing and retrieving data through the second port will be described below. For convenience of the description, it is assumed that memory cell array structures of the 1-port memory cell array 11 and the CAM cell array 13 are set to be n (rows)×m (columns)=2×2.

In the case in which the operation for comparing and retrieving the data through the second port is to be executed, all of the match lines ML<0> and ML<1> are precharged to "H" and a comparison control input signal ME is then enabled. At the same time, expectation data transferred from the outside are given as a data input signal DI2<1:0> to the driver circuit 26. Accordingly, all of the match lines ML<0> and ML<1> are brought into a selection state.

The driver circuit 26 drives each of the search line pairs SL<0> and bar SL<0> and SL<1> and bar SL<1> to "H" or "L" based on the data input signal DI2<1:0>. As a result, the expectation data and stored data can be compared for all the memory cells mc00 to mc11 of the CAM cell array 13.

The details of the comparing operation will be described below. There will be supposed the case in which expectation data of "1" are given to the search line pair SL<0> and bar SL<0> ("H" or "L" is given to the search line pair SL<0> and bar SL<0>).

In this case, if the stored contents of the memory cell mc00 is "1" (an output of the inverter 41 is "L" (an output of the inverter 42 is "H")), the NMOS transistor Q23 is turned OFF and the NMOS transistor Q24 is turned ON so that "L" is propagated to the node N23. As a result, the NMOS transistors Q25 and Q26 are maintained to be OFF and the match line ML<0> is maintained to be "H" (coincidence).

On the other hand, if the stored contents of the memory cell mc00 is "0" (the output of the inverter 41 is "H" (the output of the inverter 42 is "L")), the NMOS transistor Q23 is turned ON and the NMOS transistor Q24 is turned OFF so that "H" is propagated to the node N23. As a result, the NMOS transistors Q25 and Q26 are maintained to be ON and the match line ML<0> is led into "L" (non-coincidence).

The same comparing operation is carried out between the memory cell mc10 and the match line ML<1> which are provided between the search line pair SL<0> and bar SL<0> and between the memory cells mc01 and mc11 and the match lines ML<0> and ML<1> which are provided between the search line pair SL<1> and bar SL<1>.

In the case in which results of the comparison in both of the memory cells mc00 and mc01 are coincident with each other, accordingly, the match line ML<0> is set to be "H". On the other hand, in the case in which the results of the comparison are not coincident with each other, the match line ML<0> is set to be "L".

Similarly, in the case in which results of the comparison in both of the memory cells mc10 and mc11 are coincident with each other, the match line ML<1> is set to be "H". On the other hand, in the case in which the results of the comparison are not coincident with each other, the match line ML<1> is set to be "L".

Signals obtained from the match lines ML<0> and ML<1> are amplified by drivers 56 and 55 respectively and signals of all the match lines ML are output as 2-bit match output data M0 by the coincidence detecting circuit 27 which is not shown in FIG. 12, and furthermore, an AND of the signals of all the match lines ML is output as 1-bit output data BO. More specifically, when all the match lines ML are "H" (coincident), the hit output data BO are set to be "H". In other cases, the hit output data BO are set to be "L".

As described above, it is possible to read and write 8-bit data which are divided and held in high and low orders on a 4-bit unit in the 1-port memory cell array 11 and the CAM cell array 13 from the first port.

Then, it is possible to carry out the data comparing operation for lower 4-bit data which are held in the CAM cell array 13 from the second port. In this case, the upper 4-bit data are not accessed at all.

As a result, the semiconductor storage according to the fourth embodiment can divide, on a 4-bit unit, data to be accessed on an 8-bit length unit and can access data on a lower 4-bit unit thus obtained by the division (the comparing operation).

Thus, the semiconductor storage according to the fourth embodiment can control the 1-port memory cell array 11 and the CAM cell array 13 including memory cells having different circuit structures from each other by the row decoder 16. Therefore, it is possible to obtain a semiconductor storage having a 1-chip structure in which a single port memory cell and a CAM memory cell having different structures can be accessed at the same time.

(Layout Structure)

Figure 13:
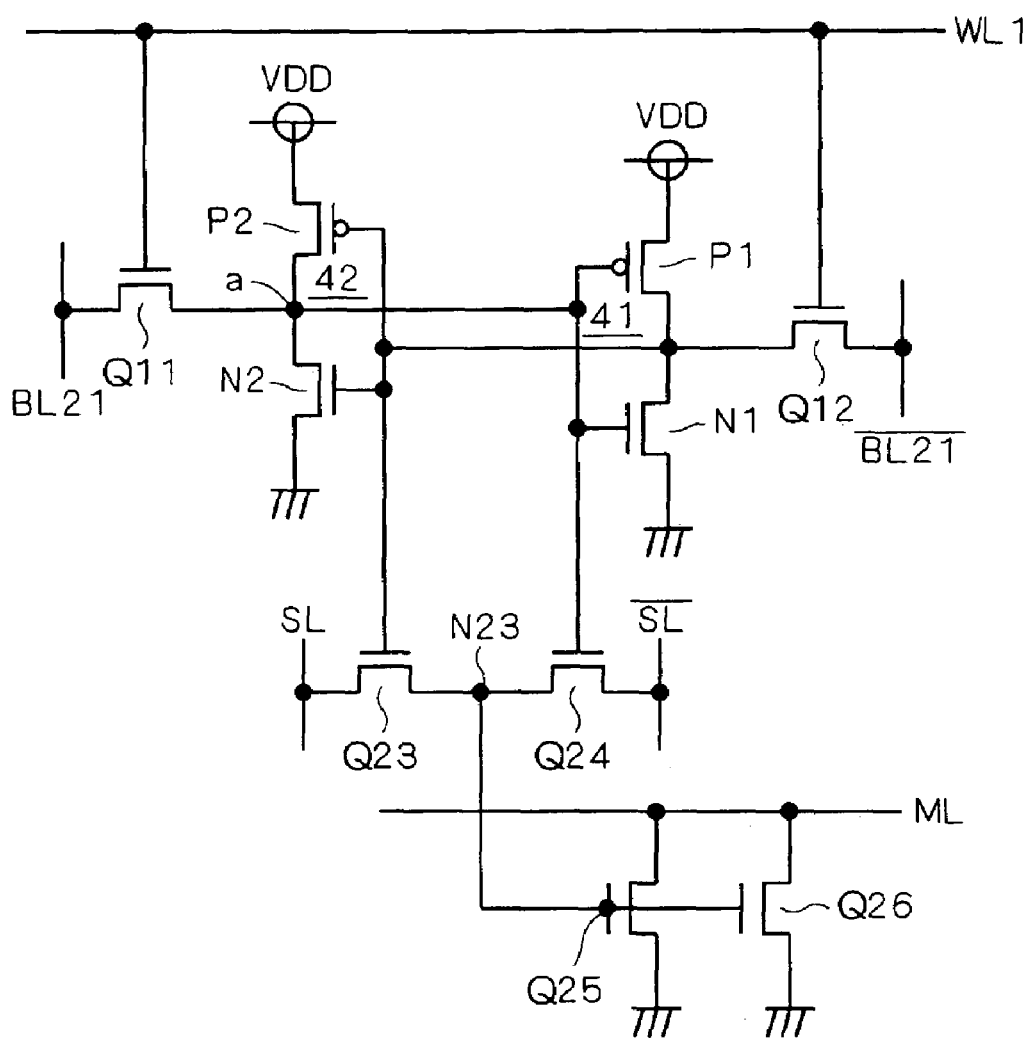
FIG. 13 is a circuit diagram showing the details of a CAM memory cell.

FIG. 13 is a circuit diagram showing the details of a CAM memory cell MC. As shown in FIG. 13, the inverter 41 is constituted by a CMOS inverter including a PMOS transistor P1 and an NMOS transistor N1 and the inverter 42 is constituted by a CMOS inverter including a PMOS transistor P2 and an NMOS transistor N2.

Other structures are the same as those described above in relation to the memory cell mc00 in FIG. 12 or the like except that the word line WL, the bit line pair BL and bar BL, the match line ML, and the search line pair SL and bar SL are generalized.

Figure 14:
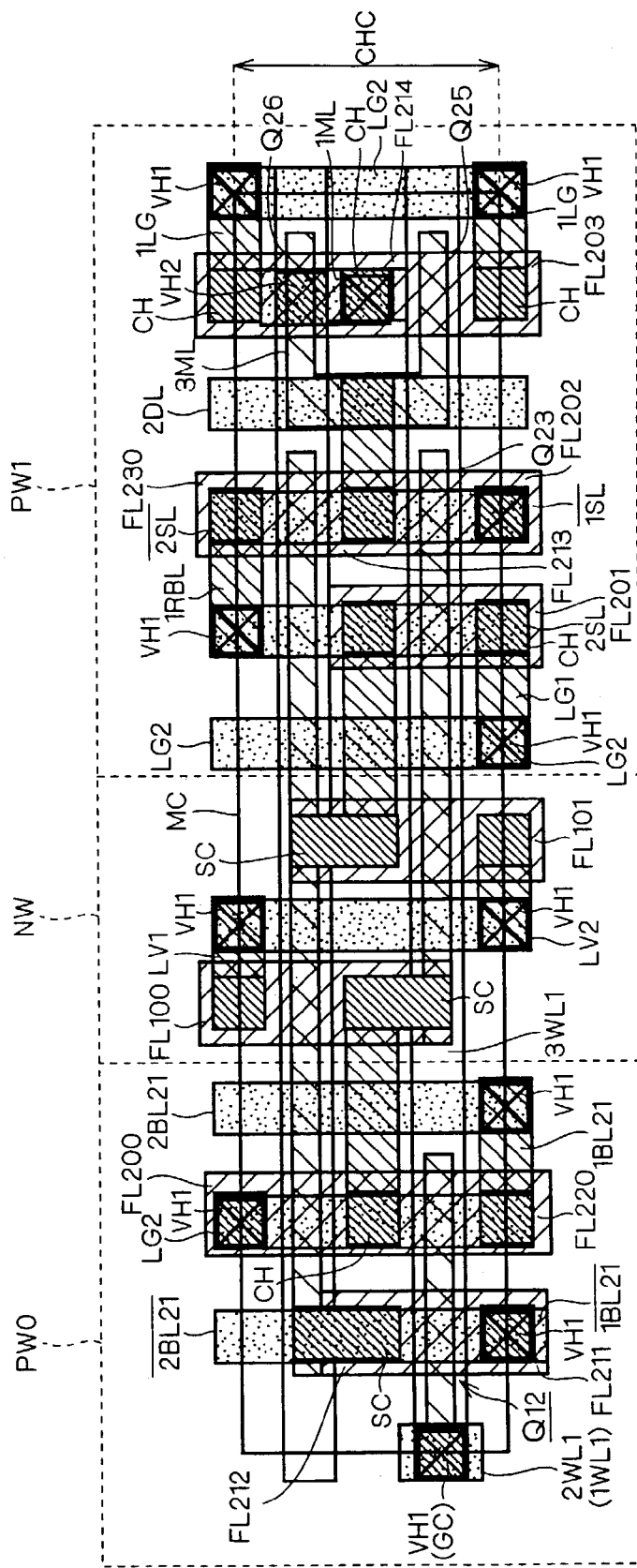
FIG. 14 is an explanatory view showing a layout structure of all layers in the CAM memory cell as seen on a plane.
Figure 15:
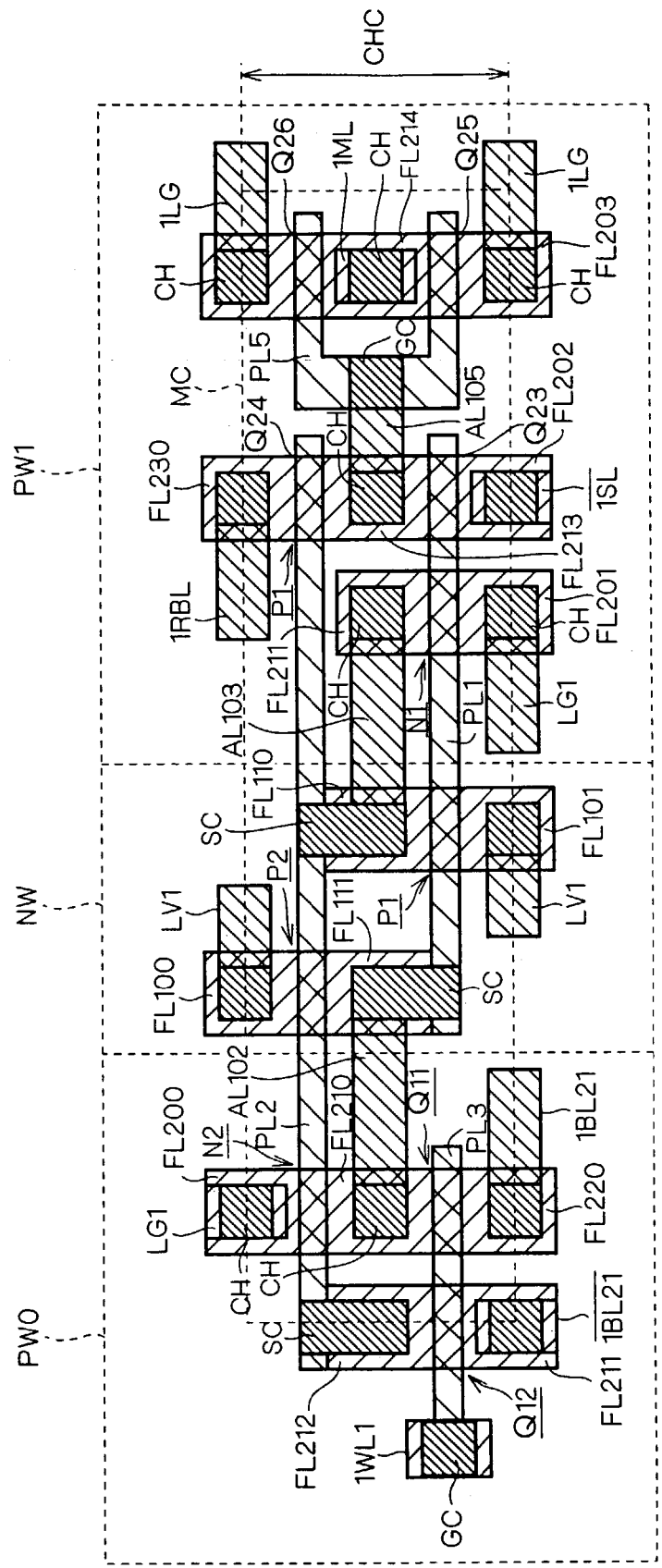
FIG. 15 is an explanatory view showing a layout structure provided under a first aluminum wiring layer in FIG. 14 as seen on a plane.
Figure 16:
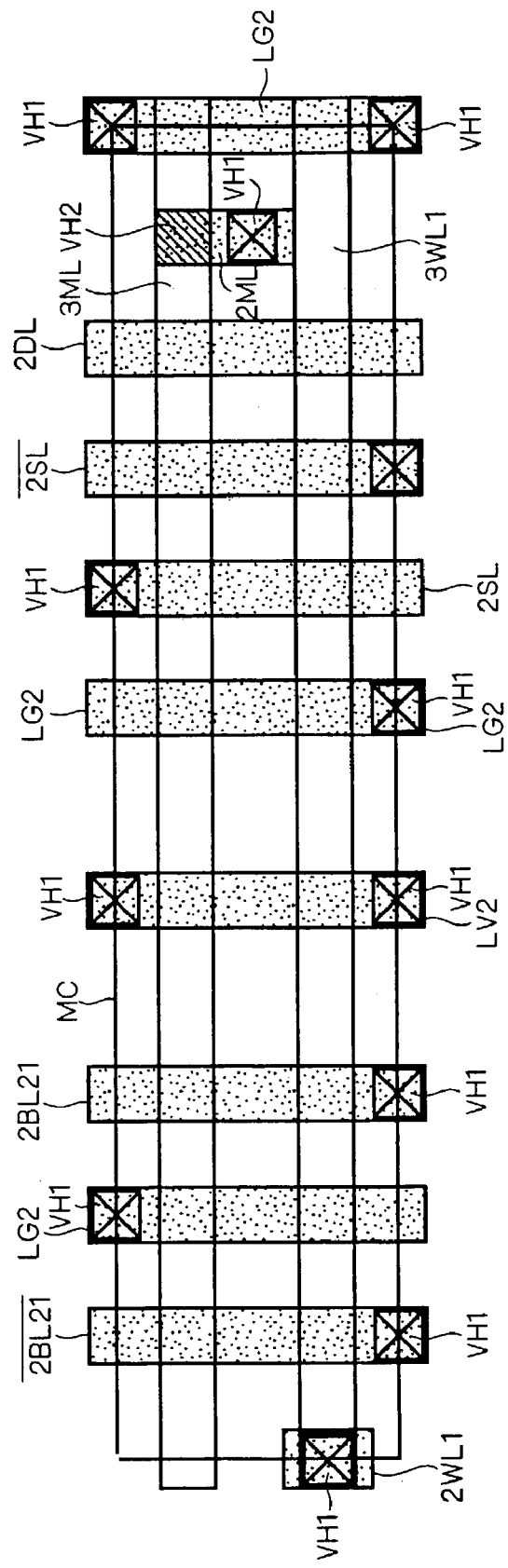
FIG. 16 is an explanatory view showing a layout structure provided above a second aluminum wiring layer in FIG. 14 as seen on a plane.

FIGS. 14 to 16 are explanatory views showing a layout structure of the CAM memory cell MC. FIG. 14 is an explanatory view showing a layout structure in all layers as seen on a plane. FIG. 15 is an explanatory view mainly showing a layout structure provided under a first aluminum wiring layer as seen on a plane. FIG. 16 is an explanatory view showing a layout structure provided above a second aluminum wiring layer as seen on a plane. In FIG. 14, the designations are partially omitted in consideration of easiness of understanding.

As shown in FIG. 15, the PMOS transistors P1 and P2 are formed in an N well region NW, the NMOS transistor N1 and the NMOS transistors Q23 to Q26 are formed in a P well region PW1, and the NMOS transistor N2 and the NMOS transistors Q11 and Q12 are formed in a P well region PW0. The P well region PW0 and the P well region PW1 are formed opposite to each other with the N well region NW interposed therebetween.

In the N well region NW, the PMOS transistor P1 is constituted by a polysilicon wiring PL1 provided across P$^+$ diffusion regions FL110 and FL101 and the PMOS transistor P2 is constituted by a polysilicon wiring PL2 provided across P$^+$ diffusion regions FL100 and FL111.

In the P well region PW1, the NMOS transistors N1 and Q23 are constituted by the polysilicon wiring PL1 provided across N$^+$ diffusion regions FL201 and FL211 and FL202 and FL213, and the NMOS transistor Q24 is constituted by the polysilicon wiring PL2 provided across N$^+$ diffusion regions FL230 and FL213. The polysilicon wiring PL1 is formed from the N well region NW to the P well region PW1 and is thus shared as gates of the NMOS transistors N1 and Q23 and the PMOS transistor P1.

Furthermore, the NMOS transistor Q25 is constituted by an upper side section PL5a of the polysilicon wiring PL5 provided across the N$^+$ diffusion regions FL203 and FL214, and the NMOS transistor Q26 is constituted by a lower side section PL5b of the polysilicon wiring PL5 provided across the N$^+$ diffusion regions FL214 and FL231. The polysilicon wiring PL5 is formed to be cross U-shaped in which two sides (PL5a and PL5b) are provided in parallel with each other, and is shared by the NMOS transistors Q25 and Q26.

In the P well region PW0, the NMOS transistor N2 is constituted by the polysilicon wiring PL2 provided across N$^+$ diffusion regions FL200 and FL210 and the NMOS transistors Q11 and Q12 are constituted by a polysilicon wiring PL3 provided across N$^+$ diffusion regions FL210 and FL220, and FL212 and FL221, respectively. The polysilicon wiring PL2 is formed from the P well region PW1 to the P well region PW0 through the N well region NW and is thus shared as gates of the NMOS transistor Q24, the PMOS transistor P2 and the NMOS transistor N2, and the polysilicon wiring PL3 is shared as gates of the NMOS transistors Q11 and Q12.

Moreover, the polysilicon wiring PL1, the polysilicon wiring PL3 and the upper side section PL5a of the polysilicon wiring PL5 are formed on the same straight line, and the polysilicon wiring PL2 and the lower side section 5b of the polysilicon wiring PL5 are formed on the same straight line.

As a result, the PMOS transistor P1 and the NMOS transistors N1, Q11, Q12, Q23 and Q25 can be formed along the same straight line and the PMOS transistor P2 and the NMOS transistors N2, Q24 and Q26 can be formed along the same straight line. Consequently, a cell height CHC of the CAM memory cell MC can be set corresponding to two transistors in the same manner as the single port memory cell MS (CHC=HC1).

In the P well region PW0, a ground wiring LG1 provided on the N$^+$ diffusion region FL200 is electrically connected to the diffusion region FL200 through a diffusion contact hole CH. The polysilicon wiring PL3 is electrically connected to a word line 1WL1 through a gate contact hole GC, a bit line 1BL21 provided on the diffusion region FL220 is electrically connected to the diffusion region FL220 through the diffusion contact hole CH, and the inverted bit line bar 1BL21 provided on the diffusion region FL221 is electrically connected to the diffusion region FL221 through the diffusion contact hole CH.

Furthermore, the polysilicon wiring PL1 and the N$^+$ diffusion region FL212 are electrically connected to each other through the shared contact SC formed from the N$^+$ diffusion region FL212 to the polysilicon wiring PL1.

In the N well region NW, a power wiring LV1 provided on the diffusion region FL100 is electrically connected to the diffusion region FL100 through the diffusion contact hole CH, and the power wiring LV1 provided on the diffusion region FL101 is electrically connected to the diffusion region FL101 through the diffusion contact hole CH.

In the P well region PW1, the search line 1SL (the first layer aluminum wiring) provided on the diffusion region FL230 is electrically connected to the diffusion region FL230 through the diffusion contact hole CH. The inverted search line bar 1SL (the first layer aluminum wiring) provided on the diffusion region FL202 is electrically connected to the diffusion region FL202 through the diffusion contact hole CH.

The aluminum wiring AL105 to be the first layer aluminum wiring extended from the diffusion region FL213 to the polysilicon wiring PL5 is electrically connected to the diffusion region FL213 through the diffusion contact hole CH1, and is electrically connected to the polysilicon wiring PL5 through the gate contact hole GC.

The ground wiring LG1 provided on the diffusion region FL201 is electrically connected to the diffusion region FL201 through the diffusion contact hole CH, the ground wiring LG1 provided on the diffusion region FL203 is electrically connected to the diffusion region FL203 through the diffusion contact hole CH, and the ground wiring LG1 provided on the diffusion region FL231 is electrically connected to the diffusion region FL231 through the diffusion contact hole CH.

The match line 1ML (the first layer aluminum wiring) provided on the diffusion region FL214 is electrically connected to the diffusion region FL214 through the diffusion contact hole CH.

The aluminum wiring AL102 to be the first layer aluminum wiring which is extended from the diffusion region FL210 of the P well region PW0 to the diffusion region FL111 of the N well region NW is electrically connected to the diffusion region FL210 through the diffusion contact hole CH. The aluminum wiring AL102 is electrically connected to the diffusion region FL111 and the polysilicon wiring PL1 through the shared contact SC formed from the diffusion region FL111 to the polysilicon wiring PL1.

The aluminum wiring AL103 to be the first layer aluminum wiring which is extended from the diffusion region FL211 of the P well region PW1 to the diffusion region FL110 of the N well region NW is electrically connected to the diffusion region FL211 through the diffusion contact hole CH. The aluminum wiring AL103 is electrically connected to the diffusion region FL110 and the polysilicon wiring PL2 through the shared contact SC formed from the diffusion region FL110 to the polysilicon wiring PL2.

As shown in FIG. 16, a ground wiring LG2 is electrically connected to the lower ground wiring LG1 (not shown) through a via hole VH1. A power wiring LV2 is electrically connected to the lower power wiring LV1 (not shown) through the via hole VH1.

A word line 2WL1 is electrically connected to the word line 1WL1 (not shown) through the via hole VH1, and a word line 3WL1 is electrically connected to the word line 2WL1 through a via hole VH2. These word lines 1WL1 to 3WL1 constitute the word line WL1 for the first port in FIGS. 11 to 13.

A match line 2ML is electrically connected to the match line 1ML (not shown) through the via hole VH1, and a word line 3ML is electrically connected to the match line 2ML through the via hole VH2. These match lines 1ML to 3ML constitute the match line ML for the second port in FIGS. 11 to 13.

The word lines 3WL1 and 3ML are formed across the P well regions PW0 and PW1 and the N well region NW.

The bit line 2BL21 is electrically connected to the lower bit line 1BL21 (not shown) through the via hole VH1 and the inverted bit line bar 2BL21 is electrically connected to the lower inverted bit line bar 1BL21 (not shown) through the via hole VH1.

The search line 2SL (the second layer aluminum wiring) is electrically connected to the lower search line 1SL (not shown) through the via hole VH1. The inverted search line bar 2SL (the second layer aluminum wiring) is electrically connected to the lower inverted search line bar 1SL through the via hole VH1.

The bit line pair BL21 and bar BL21 for the first port in FIGS. 11 to 13 are constituted by the bit line 2BL21, the bit line 1BL21 and the inverted bit lines bar 2BL21 and bar 1BL21, and the search line pair SL and bar SL in FIGS. 11 to 13 are constituted by the search lines 2SL and 1SL and the inverted search lines bar 2SL and bar 1SL.

A pass wiring 2DL (a second layer aluminum wiring) is formed between the inverted search line bar 2SL and the match line 2ML, and is not electrically connected to any wiring. The pass wiring 2DL does not need to be always formed.

The bit lines 2BL21 and bar 2BL21, the search lines 2SL and bar 2SL, the ground wiring LG2, the power wiring LV2 and the pass wiring 2DL are formed in parallel with each other in a longitudinal direction of the drawing over the P well regions PW1 and PW0 and the N well region NW, respectively.

Thus, a cell height of the CAM memory cell MC is set to be equal to that of the single port memory cell MS (HC1=CHC). Consequently, the single port memory cell MS and the CAM memory cell MC can be arranged adjacently without a useless region such as a spacer. In this case, the word line 1WL1, the gate contact hole GC and the via hole VH1 provided on a boundary line can be shared in the same manner as in the first embodiment shown in FIG. 7.

(Others)

It is possible to obtain the same effects as those in the third embodiment in the case in which a row decoder corresponding to the row decoder 18 is provided between the 1-port memory cell array 11 and the CAM cell array 13 as in the third embodiment in place of the row decoder 16.

<Fifth Embodiment>

(Whole Structure)

Figure 17:
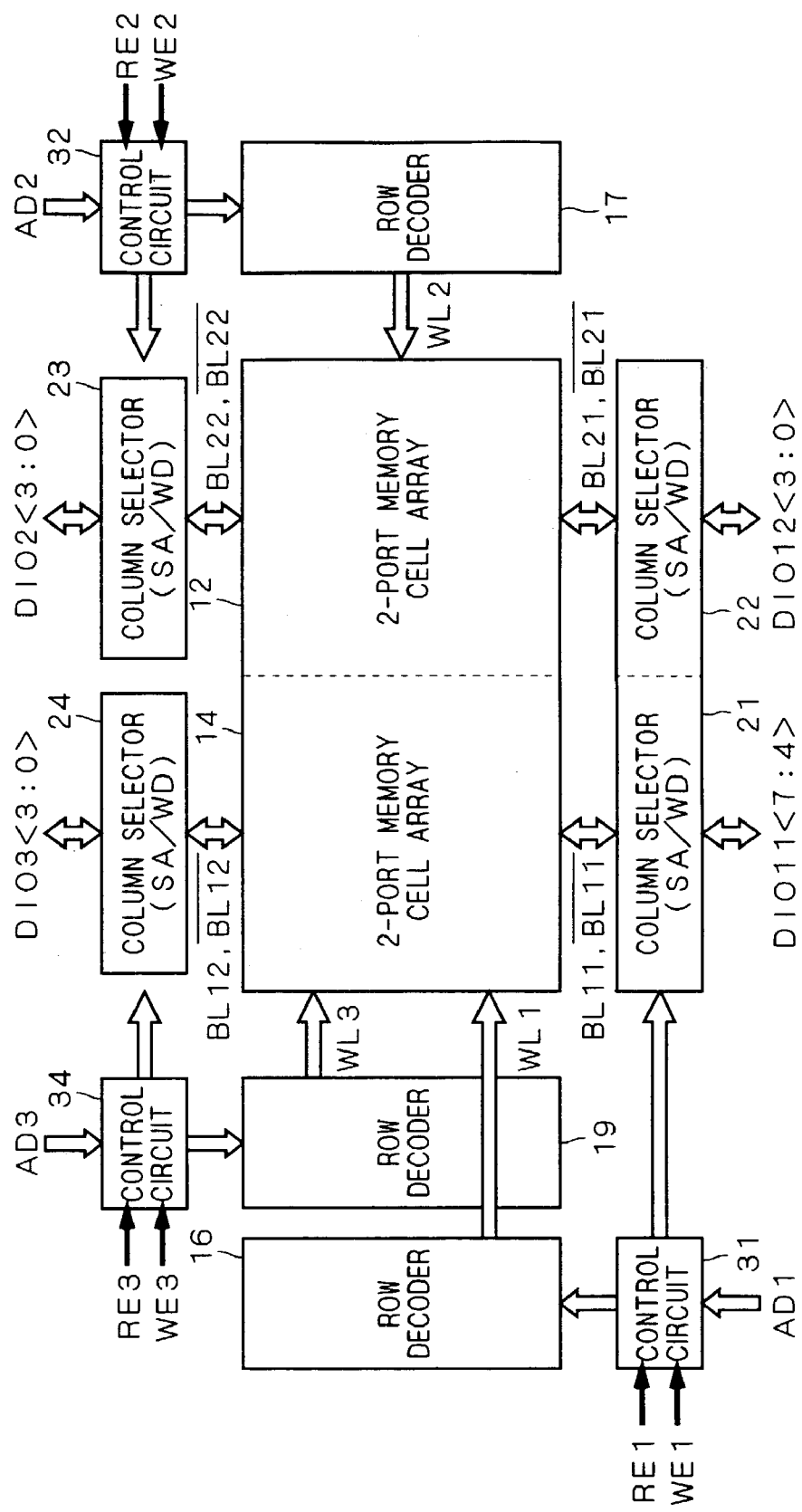
FIG. 17 is a block diagram showing a structure of a semiconductor storage according to a fifth embodiment of the present invention.

FIG. 17 is a block diagram showing a structure of a semiconductor storage according to a fifth embodiment of the present invention, As shown in FIG. 17, a 2-port memory cell array 14 (a first memory cell array) and a 2-port memory cell array 12 are provided together over one chip to constitute a memory macro. More specifically, the 2-port memory cell array 14 is provided with a word line WL1 for a first port (a first word line (a common word line)) and a word line WL3 for a second port, and the 2-port memory cell array 12 is provided with a word line WL1 for a first port (a second word line (a common word line)) and a word line WL2 for a second port (a third word line).

Since row decoders 16 and 17, control circuits 31 and 32, and column selectors 21 to 23 are the same as those in the first embodiment shown in FIG. 1, description will be omitted. For convenience of description, names of a bit line pair for the first port to be controlled by the column selector 21 are changed into BL11 and bar BL11.

Upon receipt of an address input bus signal AD3, a control circuit 34 supplies a row address to a row decoder 18 and a column address to a column selector 24 under timing control of a read control input signal RE3 and a write control input signal WE3.

A row decoder 19 drives the word lines WL3 for the second port in the 2-port memory cell array 14 based on the row address received by the control circuit 34.

The column selector 24 selects a portion equivalent to 4 bits from a plurality of bit line pairs BL12 and bar BL12 for the second port based on the column address sent from the control circuit 34 and inputs/outputs a data input/output bus signal DIO3<3:0> to/from the 2-port memory cell array 14 through the bit line pair BL12 and bar BL12 for the second port thus selected.

The column selector 24 has a sense amplifier (SA) function and a write driving (WD) function.

(Memory Cell Structure)

Figure 18:
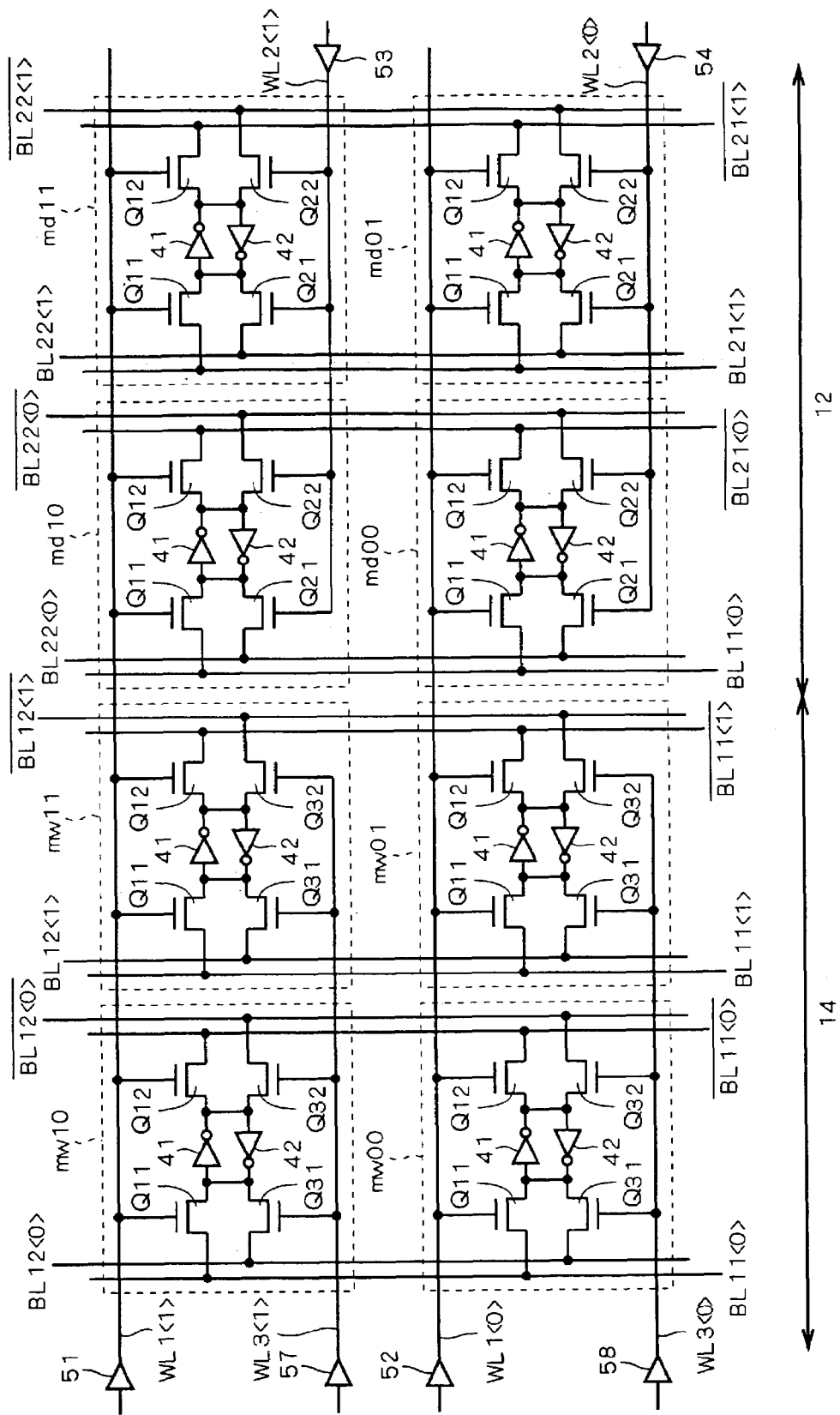
FIG. 18 is a circuit diagram showing a memory cell array structure according to the fifth embodiment.

FIG. 18 is a circuit diagram showing a memory cell array structure of the 2-port memory cell array 14 and the 2-port memory cell array 12. For convenience of explanation, FIG. 18 shows only a memory cell having a 2×2 structure but does not imply an actual size of the memory cell array (a matrix-like memory cell arrangement). Since the 2-port memory cell array 12 is the same as that in the first embodiment shown in FIG. 2, description will be omitted.

The 2-port memory cell array 14 is constituted by memory cells mw00, mw01, mw10 and mw11.

Each of the memory cells mw00 to mw11 is constituted by inverters 41 and 42 which are cross connected to each other, NMOS transistors Q11 and Q31 having electrodes connected to an input of the inverter 41, and NMOS transistors Q12 and Q32 having electrodes connected to an input of the inverter 42.

Word lines WL3<0> and WL3<1> for the second port are driven by drivers 58 and 57 (which are usually provided in the row decoder 19 (not shown)), respectively.

In the memory cells mw00 and mw01 on the same row, gate electrodes of the NMOS transistors Q11 and Q12 are electrically connected to the word line WL1<0> for the first port in common, and gate electrodes of the NMOS transistors Q31 and Q32 are electrically connected to the word line WL3<0> for the second port in common.

In the memory cells mw10 and mw11 on the same row, gate electrodes of the NMOS transistors Q11 and Q12 are electrically connected to the word line WL1<1> for the first port in common, and gate electrodes of the NMOS transistors Q31 and Q32 are electrically connected to the word line WL3<1> for the second port in common.

Both of the memory cells mw00 and mw10 on the same column are provided between a bit line pair BL11<0> and bar BL11<0> for the first port. In these memory cells mw00 and mw10, the other electrode of the NMOS transistor Q11 is electrically connected to the bit line BL11<0> for the first port and the other electrode of the NMOS transistor Q12 is electrically connected to the inverted bit line bar BL11<0> for the first port.

Furthermore, both of the memory cells mw00 and mw10 are provided between a bit line pair BL12<0> and bar BL12<0> for the second port. In these memory cells mw00 and mw10, the other electrode of the NMOS transistor Q31 is electrically connected to the bit line BL12<0> for the second port and the other electrode of the NMOS transistor Q32 is electrically connected to the inverted bit line bar BL12<0> for the second port.

Both of the memory cells mw01 and mw11 on the same column are provided between a bit line pair BL11<1> and bar BL11<1> for the first port. In these memory cells mw01 and mw11, the other electrode of the NMOS transistor Q11 is electrically connected to the bit line BL11<1> for the first port and the other electrode of the NMOS transistor Q12 is electrically connected to the inverted bit line bar BL11<1> for the first port.

Furthermore, both of the memory cells mw01 and mw11 are provided between a bit line pair BL12<1> and bar BL12<1> for the second port. In these memory cells mw01 and mw11, the other electrode of the NMOS transistor Q31 is electrically connected to the bit line BL12<1> for the second port and the other electrode of the NMOS transistor Q32 is electrically connected to the inverted bit line bar BL12<1> for the second port.

(Operation)

Since an operation for carrying out read/write from/to the 2-port memory cell array 14 through the second port is the same as that in the 2-port memory cell array 12, description will be omitted. Since other operations are the same as those of the first embodiment, description will be omitted.

In the semiconductor storage according to the fifth embodiment, therefore, the 2-port memory cell array 14 and the 2-port memory cell array 12 can be controlled by the row decoder 16. Consequently, it is possible to obtain a semiconductor storage having a 1-chip structure in which the 2-port memory cells in different memory cell arrays can be accessed at the same time.

(Comparison with Second Embodiment)

In the case in which a comparison with a structure in implementation of a semiconductor storage equivalent to that of the second embodiment is carried out by using two memory macros having a 2-port memory cell structure, the numbers of the row decoders and the control circuits can be reduced by one (both of the numbers is three in FIG. 17 and both of the numbers is four in application of the second embodiment). Thus, the degree of integration can be more enhanced than that of the second embodiment.

(Layout Structure)

The 2-port memory cell array 14 is caused to have the same layout structure as that of the 2-port memory cell array 12 according to the first embodiment shown in FIGS. 5 and 6. By setting cell heights of both of the memory cells to be equal to each other, consequently, it is possible to provide the 2-port memory cell array 12 and the 2-port memory cell array 14 adjacently without a useless region such as a spacer.

(Others)

In the case in which a row decoder corresponding to the row decoder 18 is provided between the 2-port memory cell array 12 and the 2-port memory cell array 14 as in the third embodiment in place of the row decoder 16, it is possible to obtain the same effects as those of the third embodiment.

<Sixth Embodiment>

(Whole Structure)

Figure 19:
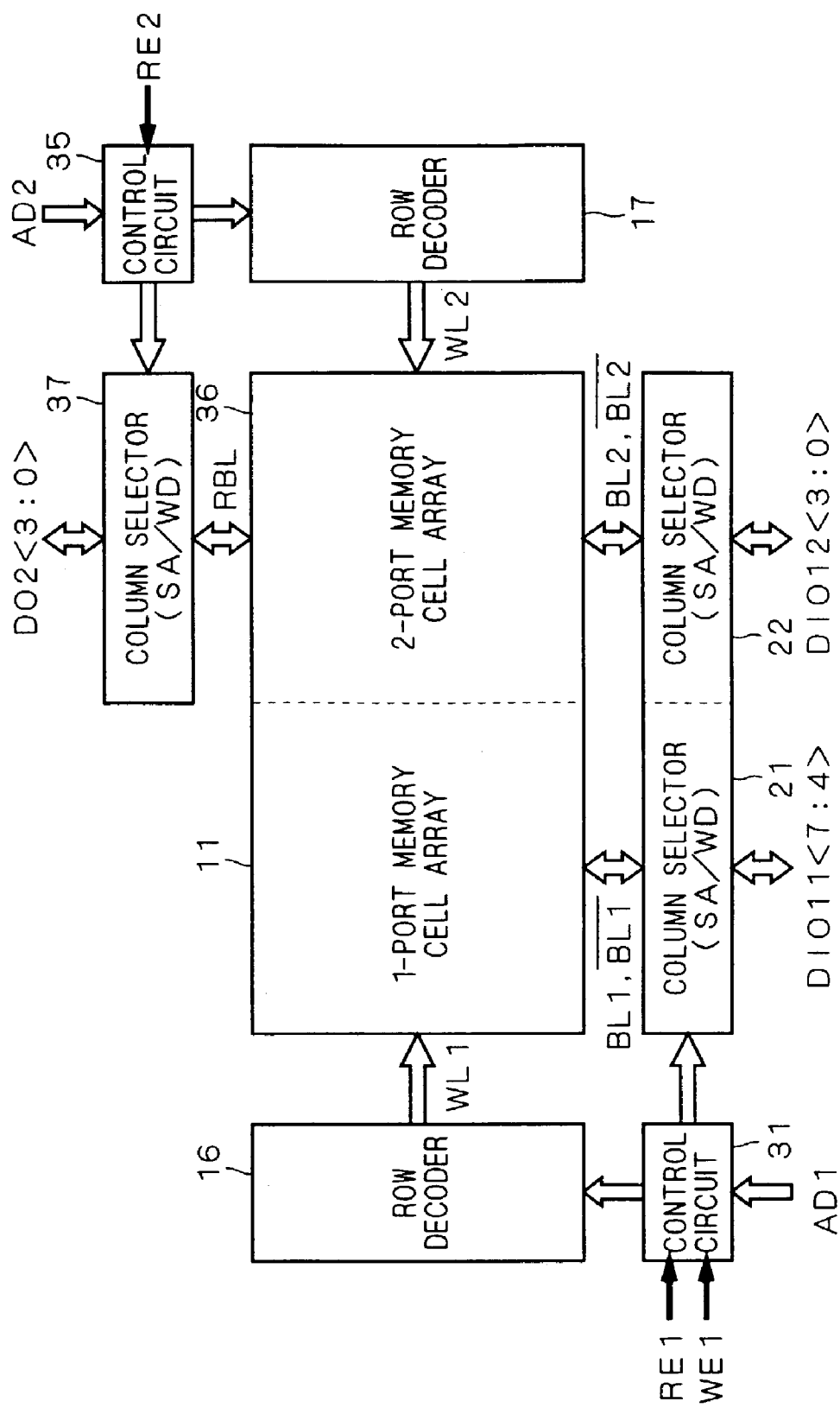
FIG. 19 is a block diagram showing a structure of a semiconductor storage according to a sixth embodiment of the present invention.

FIG. 19 is a block diagram showing a structure of a semiconductor storage according to a sixth embodiment of the present invention, As shown in FIG. 19, a 1-port memory cell array 11 and a 2-port memory cell array 36 (a second memory cell array) are provided together over one chip to constitute a memory macro. More specifically, the 1-port memory cell array 11 is provided with a word line WL1 for a first port (a first word line (a common word line)) and the 2-port memory cell array 36 is provided with a word line WL1 for a first port (a second word line (a common word line)) and a word line WL2 for a second port (a third word line).

Since row decoders 16 and 17, a control circuit 31, and column selectors 21 and 22 are the same as those in the first embodiment shown in FIG. 1, description will be omitted.

Upon receipt of an address input bus signal AD2, a control circuit 35 supplies a row address to the row decoder 17 and a column address to a column selector 37 under timing control of a read control input signal RE2.

The column selector 37 selects a portion equivalent to 4 bits from a plurality of read bit line pairs RBL for the second port based on the column address sent from the control circuit 35 and inputs/outputs a data output signal DO2<3:0> to/from the 2-port memory cell array 36 through the read bit line pair RBL thus selected.

The column selector 37 has a sense amplifier function and a drive function.

(Memory Cell Structure)

FIG. 20 is a circuit diagram showing a structure of a 2-port memory cell 38 on one unit in the 2-port memory cell array 36.

As shown in FIG. 20, an inverter 41 is constituted by a CMOS inverter including a PMOS transistor P1 and an NMOS transistor N1 and an inverter 42 is constituted by a CMOS inverter including a PMOS transistor P2 and an NMOS transistor N2.

A node Na to be an input of the inverter 41 (an output of the inverter 42) is connected to a bit line pair BL21 for the first port through an NMOS transistor N3, and a node Nb to be an input of the inverter 42 is connected to an inverted bit line bar BL21 for the first port through an NMOS transistor N4. Gate electrodes of the NMOS transistors N3 and N4 are connected to a word line WL1 for the first port.

An NMOS transistor N5 has a gate electrode connected to the node Na, a source electrode grounded, and a drain electrode connected to a read bit line RBL through an NMOS transistor N6. The NMOS transistor N6 has a gate electrode connected to a word line WL2 for a second port.

(Operation)

With reference to FIGS. 19 and 20, description will be given to a reading operation using the second port. For convenience of explanation, a memory cell array structure of the 2-port memory cell array 36 is set to be n (rows)×m (columns). Since reading and writing operations using the first port are the same as those of the first embodiment, description will be omitted.

After all the read bit lines RBL are precharged to "H", a read control input signal RE2 is enabled. When the read control input signal RE2 is brought into the enable state, the row decoder 17 for receiving a row address corresponding to an address input bus signal AD2 through the control circuit 35 selectively sets, into an active state, a word line WL2<i> (i=0 to n−1) for the second port in word lines WL2<−1:0> for the second port having n bits.

Consequently, the NMOS transistors Q21 and Q22 of each of selected memory cells of the 2-port memory cell array 36 connected to the word line WL2<i> for the second port which is set into the active state are turned ON, and contents stored in each of the selected memory cells are propagated to the corresponding read bit line RBL.

For example, when a 2-port memory cell 38 is a "0" storage (the node Na is assumed to be "H"), both the NMOS transistor N5 and the NMOS transistor N6 selected by the word line WL2 for the second port are turned ON. Consequently, the read bit line RBL is set to be "L".

On the other hand, when the 2-port memory cell 38 is a "1" storage (the node Na is assumed to be "L"), the NMOS transistor N5 is turned OFF. Consequently, the read bit line RBL is maintained to be "H" even if the NMOS transistor N6 selected by the word line WL2 for the second port is turned ON.

Thus, the contents stored in the 2-port memory cell 38 are read through all the read bit lines RBL.

The column selector 37 for receiving the column address corresponding to the address input bus signal AD2 through the control circuit 35 selects four read bit lines from m read bit line pairs RBL, and senses and amplifies them by means of an internal sense amplifier. Consequently, the data output signal DO2<3:0> is output as 4-bit read data.

As described above, it is possible to read and write 8-bit data which are divided and held in high and low orders on a 4-bit unit in the 1-port memory cell array 11 and the 2-port memory cell array 36 from the first port.

Then, it is possible to read lower 4-bit data which are held in the 2-port memory cell array 36 from the second port. In this case, the upper 4-bit data are not accessed at all.

As a result, the semiconductor storage according to the sixth embodiment can divide, on a 4-bit unit, data to be accessed on an 8-bit length unit and can access data on a lower 4-bit unit thus obtained by the division. The lower 4-bit is accessible from the first and second ports so that it is possible to carry out reading to meet a demand for a data dividing access.

In the semiconductor storage according to the sixth embodiment, thus, the 1-port memory cell array 11 and the 2-port memory cell array 36 including memory cells having different circuit structures from each other can be controlled by the row decoder 16. Therefore, it is possible to obtain a semiconductor storage having a 1-chip structure in which a single port memory cell and a 2-port memory cell having different structures can be accessed at the same time.

(Comparison with Second Embodiment)

In the case in which a comparison with a structure in implementation of a semiconductor storage equivalent to that of the sixth embodiment is carried out by using the memory macro having the 1-port memory cell structure and the memory macro having the 2-port memory cell structure as in the second embodiment, the numbers of the row decoders and the control circuits can be reduced by one (both of the numbers is two in FIG. 17 and both of the numbers is three in the structure according to the second embodiment) in the same manner as in the first embodiment. Thus, the degree of integration can be more enhanced than that of the second embodiment.

(Layout Structure)

Figure 21:
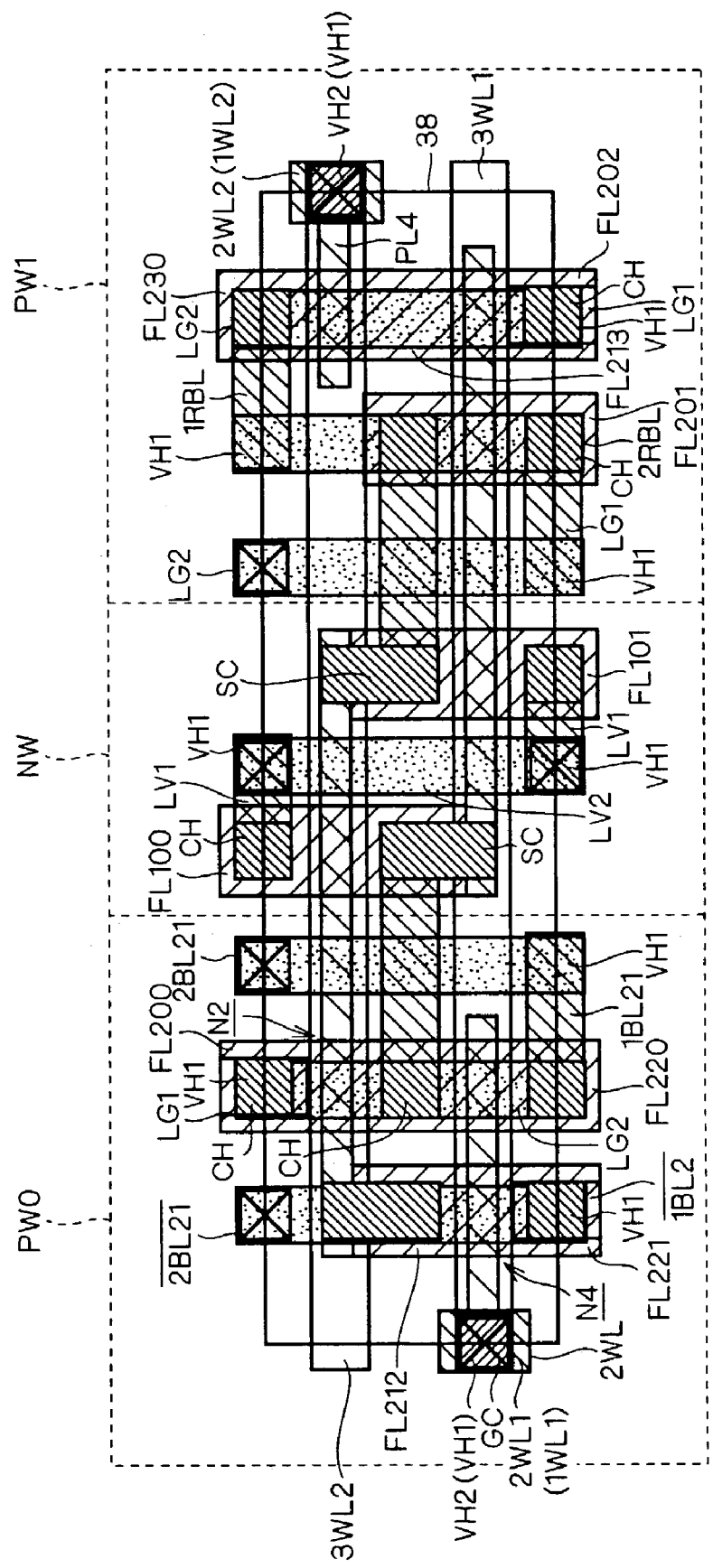
FIG. 21 is an explanatory view showing a layout structure of all layers of the 2-port memory cell according to the sixth embodiment as seen on a plane.
Figure 22:
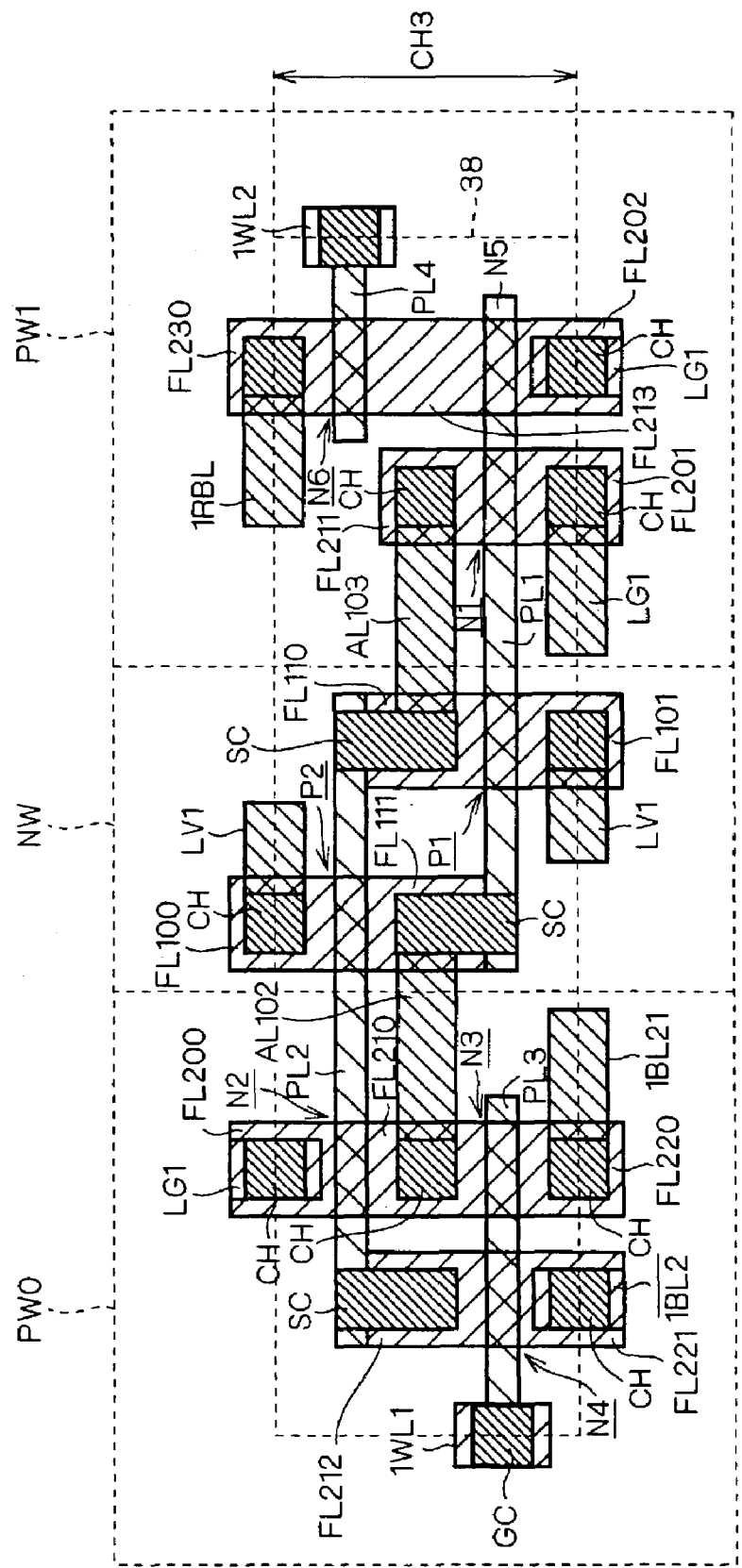
FIG. 22 is an explanatory view showing a layout structure provided under a first aluminum wiring layer in FIG. 21 as seen on a plane.
Figure 23:
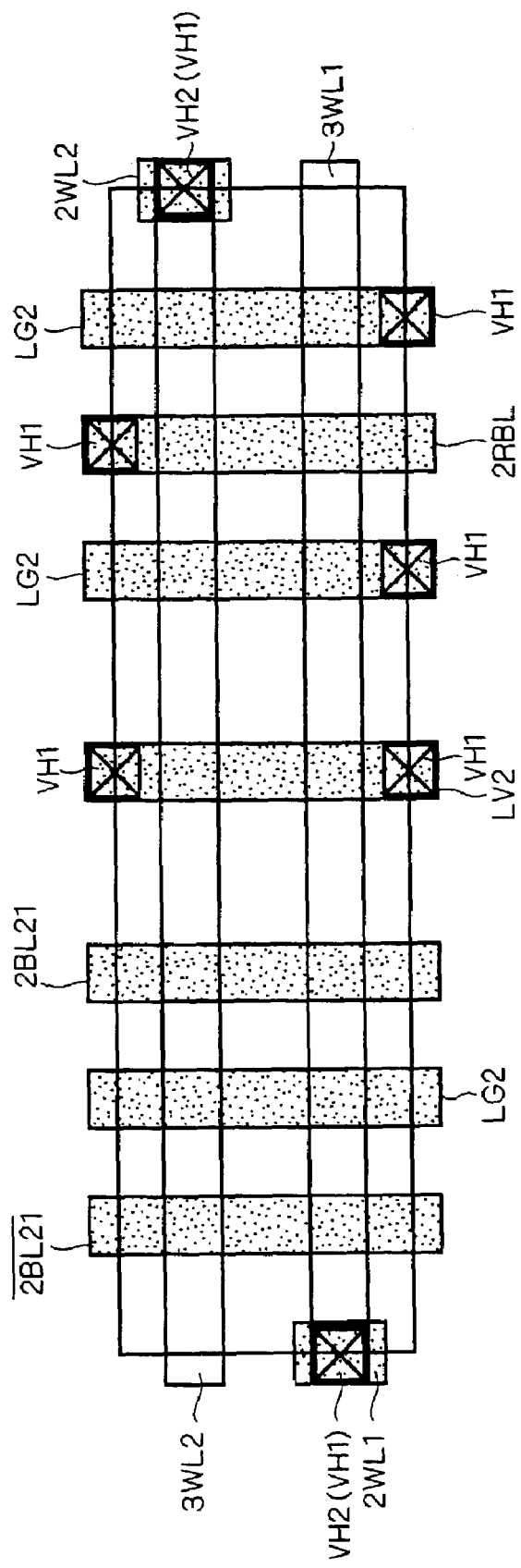
FIG. 23 is an explanatory view showing a layout structure provided above the first aluminum wiring layer in FIG. 21 as seen on a plane.

FIGS. 21 to 23 are explanatory views showing a layout structure of a 2-port memory cell 38 in the 2-port memory cell array 36. FIG. 21 is an explanatory view showing a layout structure in all layers as seen on a plane. FIG. 22 is an explanatory view mainly showing a layout structure provided under a first aluminum wiring layer as seen on a plane. FIG. 23 is an explanatory view showing a layout structure provided above a second aluminum wiring layer as seen on a plane. In FIG. 21, the designations are partially omitted in consideration of easiness of understanding.

As shown in FIG. 22, the PMOS transistors P1 and P2 are formed in an N well region NW, the NMOS transistor N1 and the NMOS transistors N5 and N6 are formed in a P well region PW1, and the NMOS transistor N2 and the NMOS transistors N3 and N4 are formed in a P well region PW0. The P well region PW0 and the P well region PW1 are formed opposite to each other with the N well region NW interposed therebetween.

In the N well region NW, the PMOS transistor P1 is constituted by a polysilicon wiring PL1 provided across $P^+$ diffusion regions FL110 and FL101 and the PMOS transistor P2 is constituted by a polysilicon wiring PL2 provided across $P^+$ diffusion regions FL100 and FL111.

In the P well region PW1, the NMOS transistors N1 and N5 are constituted by the polysilicon wiring PL1 provided across $N^+$ diffusion regions FL201 and FL211 and FL213 and FL201 and the NMOS transistor N6 is constituted by a polysilicon wiring PL4 provided across $N^+$ diffusion regions FL230 and FL213. The polysilicon wiring PL1 is formed from the N well region NW to the P well region PW1 and is thus shared as gates of the NMOS transistors N1 and N5 and the PMOS transistor P1.

In the P well region PW0, the NMOS transistor N2 is constituted by the polysilicon wiring PL2 provided across $N^+$ diffusion regions FL200 and FL210 and the NMOS transistors N3 and N4 are constituted by a polysilicon wiring PL3 provided across $N^+$ diffusion regions FL210 and FL220, and FL212 and FL221, respectively. The polysilicon wiring PL2 is formed from the N well region NW to the P well region PW0 and is thus shared as gates of the NMOS transistor N2 and the PMOS transistor P2, and the polysilicon wiring PL3 is shared as gates of the NMOS transistors N3 and N4.

Moreover, the polysilicon wiring PL1 and the polysilicon wiring PL3 are formed on the same straight line, and the polysilicon wiring PL2 and the polysilicon wiring PL4 are formed on the same straight line.

As a result, the PMOS transistor P1 and the NMOS transistors N1 and N3 to N5 can be formed along the same straight line and the PMOS transistor P2 and the NMOS transistors N2 and N6 can be formed along the same straight line. Consequently, a cell height CH3 of the 2-port memory cell 38 can be set corresponding to two transistors in the same manner as the single port memory cell MS (CH3=HC1).

The P⁺ diffusion regions FL1 ... are obtained by implanting and diffusing a P-type impurity and the N⁺ diffusion regions FL2 ... are obtained by implanting and diffusing an N-type impurity.

In the P well region PW0, a ground wiring LG1 provided on the N⁺ diffusion region FL200 is electrically connected to the diffusion region FL200 through a diffusion contact hole CH. The polysilicon wiring PL3 is electrically connected to a word line 1WL1 through a gate contact hole GC. A bit line 1BL21 provided on the diffusion region FL220 is electrically connected to the diffusion region FL220 through the diffusion contact hole CH, and the inverted bit line bar 1BL21 provided on the diffusion region FL221 is electrically connected to the diffusion region FL221 through the diffusion contact hole CH.

Furthermore, the polysilicon wiring PL1 and the N⁺ diffusion region FL212 are electrically connected to each other through the shared contact SC formed from the N⁺ diffusion region FL212 to the polysilicon wiring PL1.

In the N well region NW, a power wiring LV1 provided on the diffusion region FL100 is electrically connected to the diffusion region FL100 through the diffusion contact hole CH, and the power wiring LV1 provided on the diffusion region FL101 is electrically connected to the diffusion region FL101 through the diffusion contact hole CH.

In the P well region PW1, the read bit line 1RBL (the first layer aluminum wiring) provided on the diffusion region FL230 is electrically connected to the diffusion region FL230 through the diffusion contact hole CH.

The word line 1WL2 provided on the polysilicon wiring PL4 is electrically connected to the polysilicon wiring PL4 through the gate contact hole GC, the ground wiring LG1 provided on the diffusion region FL201 is electrically connected to the diffusion region FL201 through the diffusion contact hole CH, and the ground wiring LG1 provided on the diffusion region FL202 is electrically connected to the diffusion region FL202 through the diffusion contact hole CH.

The aluminum wiring AL102 to be the first layer aluminum wiring which is extended from the diffusion region FL210 of the P well region PW0 to the diffusion region FL111 of the N well region NW is electrically connected to the diffusion region FL210 through the diffusion contact hole CH. The aluminum wiring AL102 is electrically connected to the diffusion region FL111 and the polysilicon wiring PL1 through the shared contact SC formed from the diffusion region FL111 to the polysilicon wiring PL1.

The aluminum wiring AL103 to be the first layer aluminum wiring which is extended from the diffusion region FL211 of the P well region PW1 to the diffusion region FL110 of the N well region NW is electrically connected to the diffusion region FL211 through the diffusion contact hole CH. The aluminum wiring AL103 is electrically connected to the diffusion region FL110 and the polysilicon wiring PL2 through the shared contact SC formed from the diffusion region FL110 to the polysilicon wiring PL2.

As shown in FIG. 23, a ground wiring LG2 is electrically connected to the lower ground wiring LG1 (not shown) through a via hole VH1. A power wiring LV2 is electrically connected to the lower power wiring LV1 (not shown) through the via hole VH1.

A word line 2WL1 is electrically connected to the word line 1WL1 (not shown) through the via hole VH1, and a word line 3WL1 is electrically connected to the word line 2WL1 through a via hole VH2. These word lines 1WL1 to 3WL1 constitute the word line WL1 for the first port in FIGS. 19 and 20.

A word line 2WL2 is electrically connected to the word line 1WL2 (not shown) through the via hole VH1, and a word line 3WL2 is electrically connected to the word line 2WL2 through the via hole VH2. These word lines 1WL2 to 3WL2 constitute the word line WL2 for the second port in FIGS. 19 and 20.

The word lines 3WL1 and 3WL2 are formed across the P well regions PW0 and PW1 and the N well region NW.

The bit line 2BL21 (the second layer aluminum wiring) is electrically connected to the lower bit line 1BL21 (not shown) through the via hole VH1 and the inverted bit line bar 2BL21 (the second layer aluminum wiring) is electrically connected to the lower inverted bit line bar 1BL21 (not shown) through the via hole VH1.

The bit line 2RBL (the second layer aluminum wiring) is electrically connected to the lower bit line RBL (not shown) through the via hole VH1.

The bit line pair BL21 and bar BL21 for the first port in FIGS. 19 and 20 are constituted by the bit line 2BL21, the bit line 1BL21 and the inverted bit lines bar 2BL21 and bar 1BL21, and the read bit line RBL in FIGS. 19 and 20 is constituted by the bit line 2RBL and the bit line 1RBL.

The bit lines 2BL21 and bar 2BL21, the read bit line 2RBL, the ground wiring LG2 and the power wiring LV2 are formed in parallel with each other in a longitudinal direction of the drawing over the P well regions PW1 and PW0 and the N well region NW, respectively.

Thus, a cell height of the 2-port memory cell 38 is set to be equal to that of the single port memory cell MS (HC1=CH3). Consequently, the single port memory cell MS and the 2-port memory cell 38 can be arranged adjacently without a useless region such as a spacer. In this case, the word line 1WL1, the gate contact hole GC and the via hole VH1 provided on a boundary line can be shared in the same manner as in the first embodiment shown in FIG. 7.

(Others)

It is possible to obtain the same effects as those in the third embodiment in the case in which a row decoder corresponding to the row decoder 18 is provided between the 1-port memory cell array 11 and the 2-port memory cell array 36 as in the third embodiment in place of the row decoder 16.

<Seventh Embodiment>

(Whole Structure)

Figure 24:
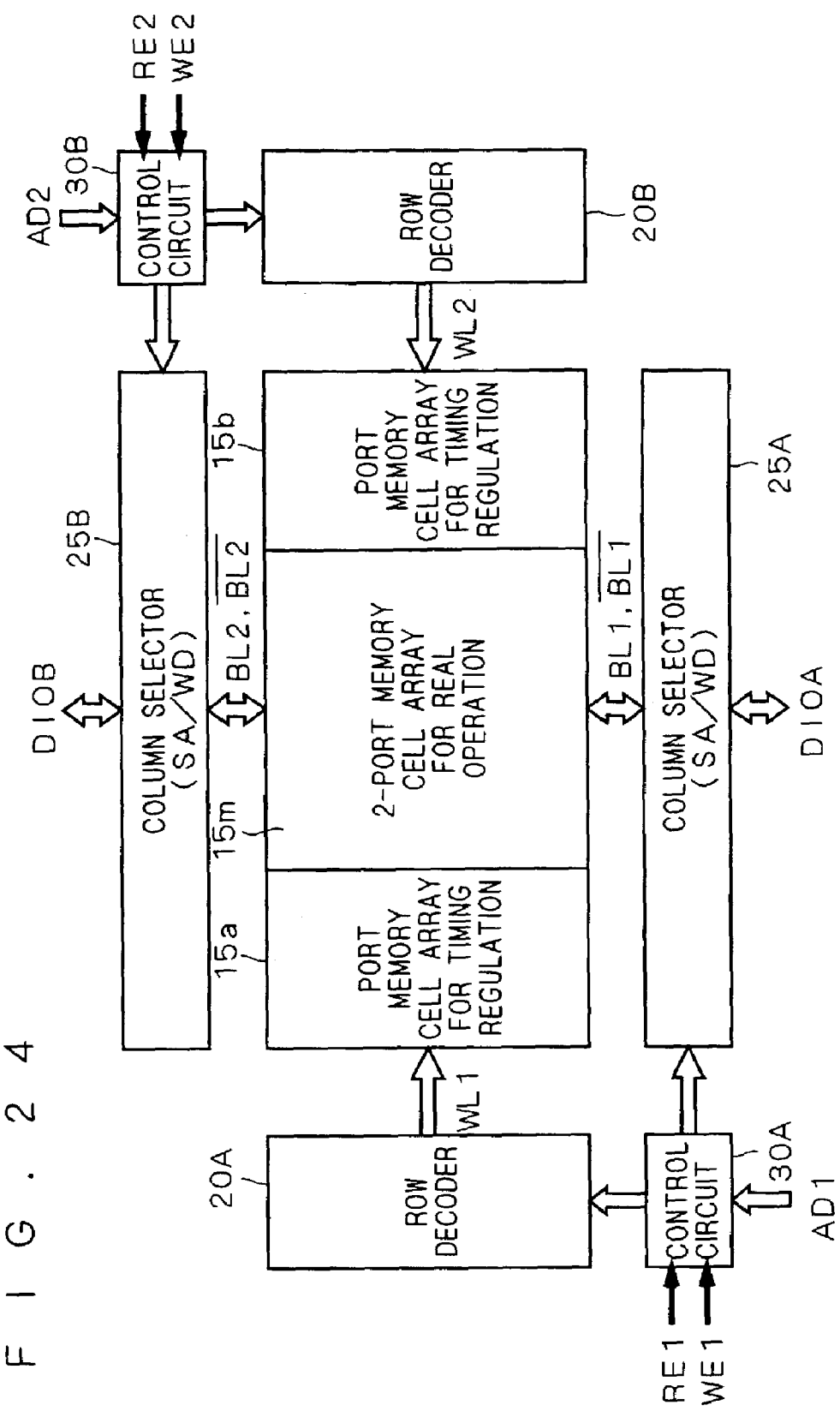
FIG. 24 is a block diagram showing a structure of a semiconductor storage according to a seventh embodiment of the present invention.

FIG. 24 is a block diagram showing a structure of a semiconductor storage according to a seventh embodiment of the present invention, As shown in FIG. 24, 1-port memory cell arrays 15a (a first memory cell array) and 15b (a third memory cell array) for timing regulation are formed on both ends to interpose a 2-port memory cell array 15m (a second memory cell array) for a real operation formed in a central part therebetween. These memory cell arrays 15a, 15b and 15m are formed integrally. A plurality of dummy cells in at least one column are arranged over a plurality of rows in the 1-port memory cell arrays 15a and 15b for timing regulation.

Upon receipt of an address input bus signal AD1, a control circuit 30A supplies a row address to a row decoder 20A and a column address to a column selector 25A under timing control of a read control input signal RE1 and a write control input signal WE1.

Upon receipt of an address input bus signal AD2, a control circuit 30B supplies a row address to a row decoder 20B and a column address to a column selector 25B under timing control of a read control input signal RE2 and a write control input signal WE2.

The row decoder 20A (the first row decoder) drives a plurality of word lines WL1 for the first port (first and second word lines (common word lines)) based on the row address, and the row decoder 20B drives a plurality of word lines WL2 for the second port (a third word line) based on the row address.

The column selector 25A selects a predetermined bit from a plurality of bit line pairs BL1 and bar BL1 for the first port based on the column address sent from the control circuit 30A, and inputs/outputs a data input/output bus signal DIOA to/from the 1-port memory cell array 11 through the bit line pairs BL1 and bar BL1 for the first port thus selected.

The column selector 25B selects a predetermined bit from a plurality of bit line pairs BL2 and bar BL2 for the second port based on the column address sent from the control circuit 30B, and inputs/outputs a data input/output bus signal DIOB to/from the 2-port memory cell array 12 through the bit line pairs BL2 and bar BL2 for the second port thus selected.

These column selectors 25A and 25B have an SA function, a WD function and a dummy sense function which will be described below.

(Memory Cell Structure)

Figure 25:
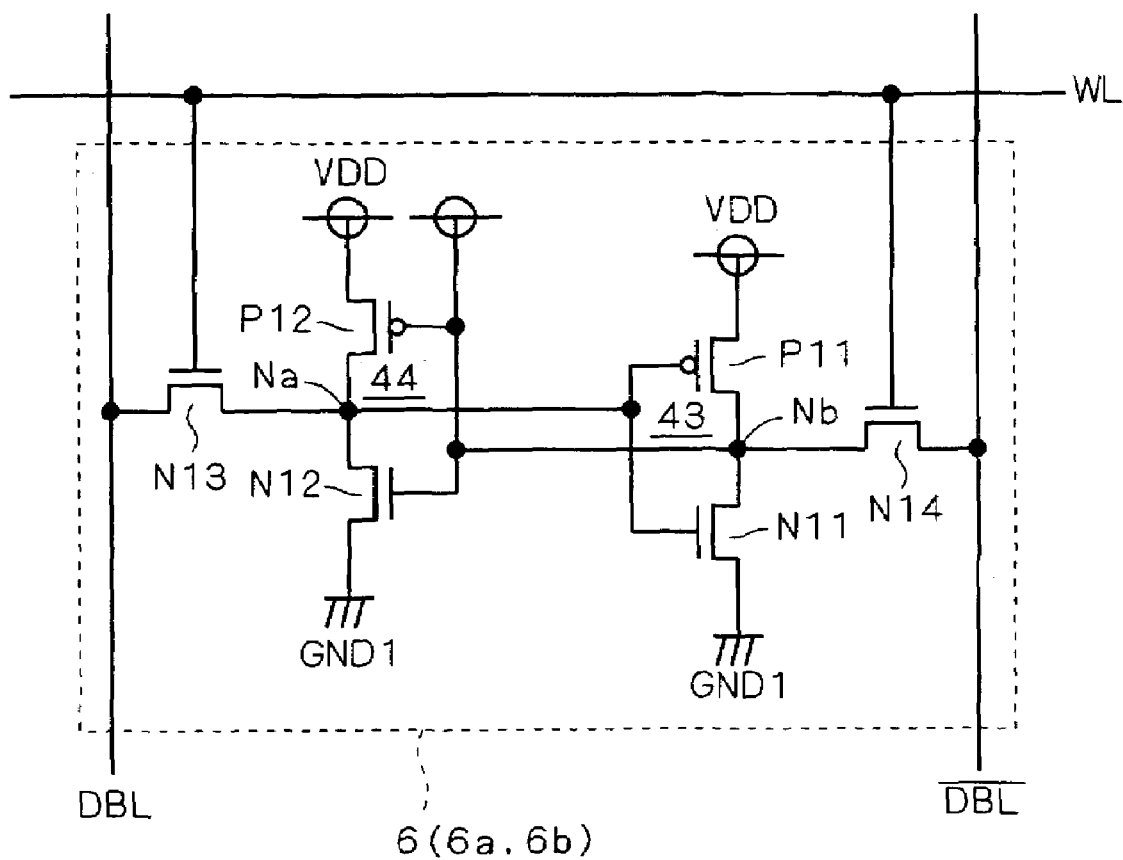
FIG. 25 is a circuit diagram showing a structure of a dummy cell formed in a memory cell area for timing regulation.

FIG. 25 is a circuit diagram showing a structure of a dummy cell 6 (6a, 6b) formed in 1-port memory cell arrays 15a and 15b for timing regulation.

As shown in FIG. 25, an inverter 43 is constituted by a CMOS inverter including a PMOS transistor P11 and an NMOS transistor N11 and an inverter 44 is constituted by a CMOS inverter including a PMOS transistor P12 and an NMOS transistor N12.

An input section of the inverter 44 (gates of the PMOS transistor P12 and the NMOS transistor N12) is fixed at a supply voltage.

The dummy cell 6 is constituted by an NMOS transistor N13 having one of electrodes connected to an input (a node Na) of the inverter 43 and an NMOS transistor N14 having one of electrodes connected to an input (a node Nb) of the inverter 44.

Gate electrodes of the NMOS transistors N13 and N14 are electrically connected to the word line WL (WL1 and WL2) in common, the other electrode of the NMOS transistor N13 is electrically connected to a dummy DBL, and the other electrode of the NMOS transistor N14 is electrically connected to an inverted dummy bit line bar DBL.

Figure 26:
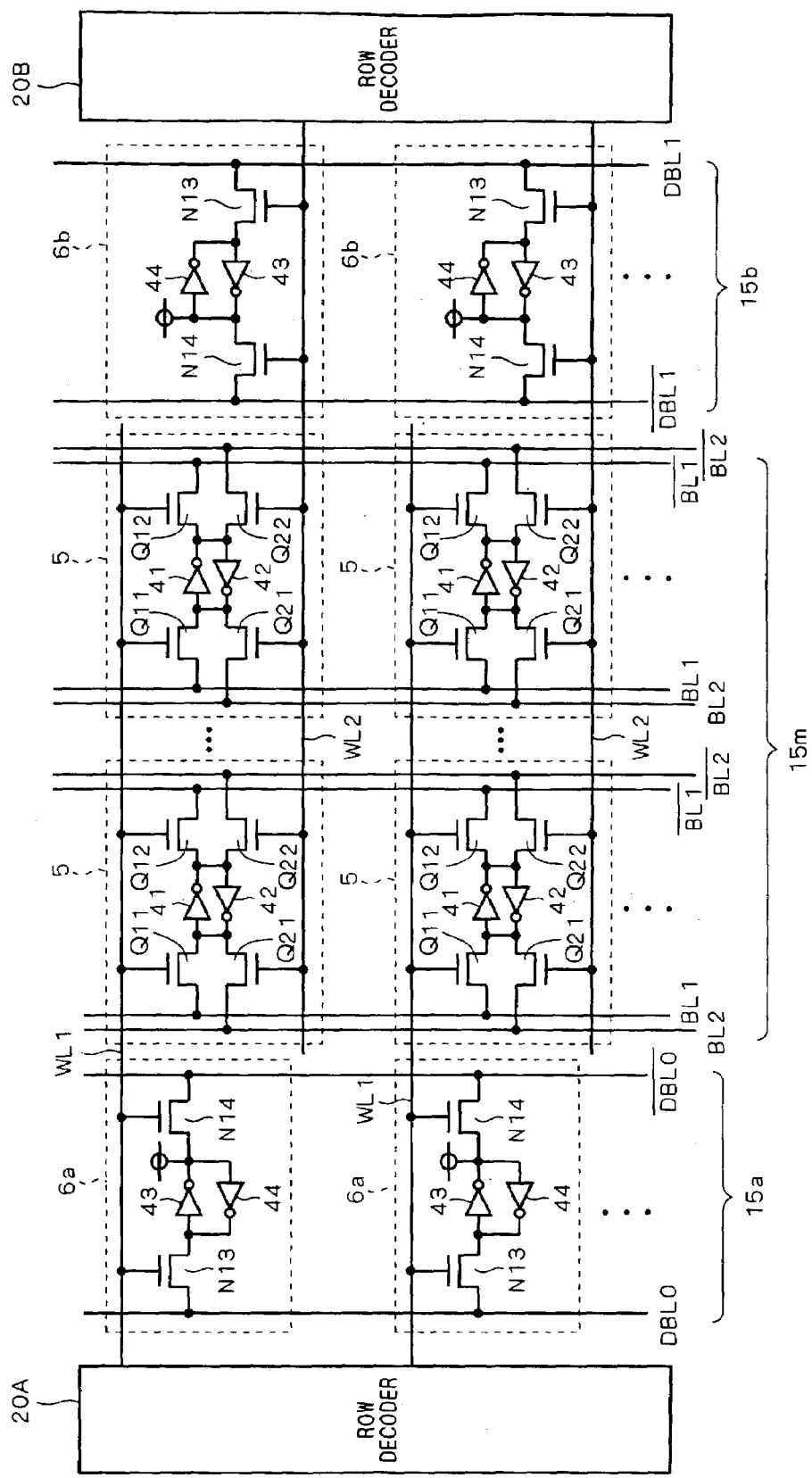
FIG. 26 is a circuit diagram showing a memory cell array structure according to the seventh embodiment.

FIG. 26 is a circuit diagram showing a memory cell array structure of a 2-port memory cell array 15m for a real operation and the 1-port memory cell arrays 15a and 15b for timing regulation. For convenience of explanation, FIG. 26 shows only a memory cell having a 2×2 structure in the 2-port memory cell array 15m for the real operation but does not imply an actual size of the memory cell array (a matrix-like memory cell arrangement).

The row decoder 20A selectively sets one of the word lines WL1 for the first port to be "H". The row decoder 20B selectively sets one of the word lines WL2 for the second port to be "H".

The 2-port memory cell 5 is constituted by inverters 41 and 42 which are cross connected to each other, NMOS transistors Q11 and Q21 having electrodes connected to an input of the inverter 41, and NMOS transistors Q12 and Q22 having electrodes connected to an input of the inverter 42.

In the 2-port memory cell 5 on the same row, gate electrodes of the NMOS transistors Q11 and Q12 are electrically connected to the word line WL1 for the first port in common and gate electrodes of the NMOS transistors Q21 and Q22 are electrically connected to the word line WL2 for the second port in common.

In the 2-port memory cell 5 on the same column, the other electrodes of the NMOS transistors Q11 and Q12 are electrically connected to the common bit lines BL1 and bar BL1 for the first port respectively and the other electrodes of the NMOS transistors Q21 and Q22 are electrically connected to the common bit lines BL2 and bar BL2 for the second port respectively.

In the dummy cell 6a of the 1-port memory cell array 15a for timing regulation, the gate electrodes (first dummy ports) of the NMOS transistors N13 and N14 are electrically connected to the word line WL1 for the first port in common and the other electrodes of the NMOS transistors N13 and N14 are electrically connected to dummy bit lines DBL0 and bar DBL1 respectively.

In the dummy cell 6b of the 1-port memory cell array 15b for timing regulation and the gate electrodes (second dummy ports) of the NMOS transistors N13 and N14 are electrically connected to the word line WL2 for the second port in common and the other electrodes of the NMOS transistors N13 and N14 are electrically connected to dummy bit lines DBL1 and bar DBL1 respectively.

In the semiconductor storage according to the seventh embodiment, thus, the 1-port memory cell arrays 15a and 15b for timing regulation are provided on both ends of the 2-port memory cell array 15m for the real operation.

(Timing Regulating Operation)

A timing regulating operation to be carried out by the dummy cell 6 with such a structure will be described for the dummy cell 6a of the 1-port memory cell array 15a for timing regulation.

In execution of a first port reading operation of the 2-port memory cell array 15m for the real operation and the 1-port memory cell array 15a for timing regulation, when the dummy bit line pair DBL and bar DBL are precharged to be "H" and the word line WL1 for the first port thus selected is then set to be "H", an electric potential of a dummy bit line DBL0 of the dummy cell 6a connected to the word line WL1 for the first port thus selected is extracted into "L" and an electric potential of an inverted dummy bit line bar DBL0 is held to be "H".

In this case, the fact that an electric potential of the dummy bit line DBL extracted to be the "L" level is detected by a dummy sense function in the column selector 25A (a voltage level detecting circuit or a dummy sense circuit) is set to be a trigger, and a sense amplifier activating signal for activating the SA function for the 2-port memory cell array 15m for the real operation is thus brought into an active state. As a result, it is possible to carry out a stable reading operation for the 2-port memory cell 5 of the 2-port memory cell array 15m for the real operation.

Accordingly, a transistor size of the dummy cell 6a is adapted to the 2-port memory cell 5 and is thus optimized. Thus, a desirable read timing can be obtained.

By carrying out the timing regulating operation in the same manner for the dummy cell 6b, similarly, it is possible to produce the same effects in the reading operation of the second port.

Thus, the dummy cell 6a is used for generating a reading timing of the first port and the dummy cell 6b is used for generating a reading timing of the second port. Consequently, it is possible to regulate the reading timing without a hindrance by using the dummy cells 6a and 6b having a smaller number of ports than those of the 2-port memory cell 5.

Since an operation for reading two ports in the 2-port memory cell array 15m for the real operation is the same as an operation for existing two ports and the 2-port memory cell, description will be omitted.

(Layout Structure)

A 1-port memory cell having a different port structure from that of the 2-port memory cell 5 provided in the 2-port memory cell array 15m for the real operation is used for the dummy cell 6. In general, a cell size of the 2-port memory cell has an area which is equal to an approximately double of an approximately double area of the 1-port memory cell. This is also apparent from a comparison of the layout structure of the memory cell structure (see FIGS. 3, 4 and 7) of the 1-port memory cell array 11 according to the first embodiment with the layout structure of the memory cell structure (see FIGS. 5 to 7) of the 2-port memory cell array 12, for example.

As a result, the semiconductor storage according to the seventh embodiment comprises the 1-port memory cell arrays 15a and 15b for timing regulation including the dummy cell 6 having a 1-port structure adjacently to the 2-port memory cell area 15m for the real operation. Consequently, it is possible to produce an advantage that formation areas of the 1-port memory cell arrays 15a and 15b for timing regulation can be reduced, and furthermore, the degree of integration of the whole apparatus can be enhanced.

More specifically, in the semiconductor storage according to the seventh embodiment, the number of the ports that the dummy cell can access is set to be smaller than that of the ports that the 2-port memory cell 5 to be the memory cell for the real operation can access. Consequently, it is possible to enhance the degree of integration of the apparatus with a reduction in the formation area.

While the invention has been shown and described in detail, the foregoing description is in all aspects illustrative and not restrictive. It is therefore understood that numerous modifications and variations can be devised without departing from the scope of the invention.

What is claimed is:

1. A semiconductor storage comprising first and second memory cell arrays,
   said first memory cell array including:
   a plurality of first memory cells arranged in at least one column over a plurality of rows; and
   a plurality of first word lines to be connected to said first memory cells on a row unit,
   said second memory cell array including:
   a plurality of second memory cells arranged in a matrix, said second memory cells including a different number of elements than said first memory cells;
   a plurality of second word lines to be connected to said second memory cells on a row unit;
   a plurality of third word lines connected to said second memory cells on a row unit and not connected to any of said plurality of first memory cells;
   a plurality of first bit lines provided corresponding to said second memory cells on a column unit and being accessible to said second memory cell connected to said second word line in a selection state out of said plurality of second word lines; and
   a plurality of second bit lines provided corresponding to said second memory cells on a column unit and being accessible to said second memory cell connected to said third word line in a selection state out of said plurality of third word lines,
   said semiconductor storage further comprising:
   a first row decoder configured to select, so that a period wherein any of said first word lines is brought into a selection state based on a first address signal and a period wherein any of said second word lines is brought into a selection state based on said first address signal are overlapped.

2. The semiconductor storage according to claim 1, wherein
   said first memory cells include a plurality of memory cells arranged in a matrix; and
   said first and second word lines include a plurality of common word line to be shared on a row unit.

3. The semiconductor storage according to claim 1, wherein
   said first memory cells include a plurality of memory cells arranged in a matrix; and
   said first row decoder is provided between said first and second memory cell arrays.

4. The semiconductor storage according to claim 1, wherein
   said first and second memory cells include circuit structures having different port structures from each other.

5. The semiconductor storage according to claim 4, wherein
   said first memory cell includes a memory cell having a 1-port structure which can be accessed by only a first port,
   said second memory cell includes a memory cell having a 2-port structure which can be accessed by said first port and a second port, and
   an access to be carried out by said first row decoder in a selection state of said first and second word lines includes an access to be preformed by said first port.

6. The semiconductor storage according to claim 5, further comprising:
   a second row decoder for bringing any of said plurality of said third word lines into a selection state based on a second address signal,
   an access to be carried out by said second row decoder in a selection state of said third word line including an access to be performed by said second port.

7. The semiconductor storage according to claim 5, wherein
   said second memory cell includes a memory cell having a 2-port structure in which reading and writing can be carried out by said second port.

8. The semiconductor storage according to claim 5, wherein
   said second memory cell includes a content addressable memory cell in which a comparison result between an expected value given from an outside and self-stored contents can be output from said second port.

9. The semiconductor storage according to claim 5, wherein
   said second memory cell includes a memory cell having a 2-port structure in which only reading using said second port can be carried out.

10. The semiconductor storage according to claim 5, wherein
    said first memory cell and said second memory cell have cell heights to be formation lengths in a predetermined direction on a layout structure which are set to be equal to each other.

11. The semiconductor storage according to claim 4, further comprising:
- a second row decoder for bringing any of said plurality of said third word lines into a selection state based on a second address signal, wherein
- said first memory cell includes a memory cell having a 2-port structure which can be accessed by a first port and a second port,
- said second memory cell including a memory cell having a 2-port structure which can be accessed by said first port and a third port which is different from said second port,
- an access to be carried out by setting said first and second word lines into a selection state by said first row decoder including an access to be performed by said first port, and
- an access to be carried out by setting said third word line into a selection state by said second decoder including an access to be performed by said third port.

12. The semiconductor storage according to claim 1, wherein
- said plurality of first memory cells include a plurality of first dummy cells and said plurality of second memory cells include a plurality of memory cells for a real operation,
- said plurality of first and second word lines include a plurality of common word lines to be shared on a row unit, and
- the number of accessible ports of said first dummy cells is set to be smaller than that of accessible ports of said memory cells for a real operation.

13. The semiconductor storage according to claim 12, further comprising:
- a second row decoder for bringing any of said plurality of third word lines into a selection state based on a second address signal; and
- a third memory cell array having a plurality of second dummy cells arranged in at least a column over a plurality of rows, said first and third memory cell arrays being formed integrally with said second memory cell array interposed therebetween and the number of accessible ports of said second dummy cell being set to be smaller than that of accessible ports of said memory cells for a real operation,
- said memory cells for a real operation including a memory cell having a 2-port structure with first and second ports which are accessible,
- said first and second dummy cells including a memory cell having a 1-port structure with first and second dummy ports which are accessible,
- said first ports of said plurality of memory cells for a real operation and said first dummy ports of said plurality of first dummy cells being connected to said plurality of common word lines on a row unit in common,
- said second ports of said plurality of memory cells for a real operation and said second dummy ports of said plurality of second dummy cells being connected to said plurality of third word lines on a row unit in common,
- said first row decoder including a row decoder provided in the vicinity of said first memory cell array, and
- said second row decoder including a row decoder provided in the vicinity of said third memory cell array.

14. The semiconductor storage according to claim 13, wherein
- said first and second dummy cells include a memory cell for reading timing regulation with respect to said memory cell for a real operation.

15. A semiconductor storage comprising first and second memory cell arrays,
- said first memory cell array including:
- a plurality of first memory cells arranged in at least one column over a plurality of rows; and
- a plurality of first word lines to be connected to said first memory cells on a row unit,
- said second memory cell array including:
- a plurality of second memory cells arranged in a matrix;
- a plurality of second word lines to be connected to said second memory cells on a row unit;
- a plurality of third word lines connected to said second memory cells on a row unit and not connected to any of said plurality of first memory cells;
- a plurality of first bit lines provided corresponding to said second memory cells on a column unit and being accessible to said second memory cell connected to said second word line in a selection state out of said plurality of second word lines; and
- a plurality of second bit lines provided corresponding to said second memory cells on a column unit and being accessible to said second memory cell connected to said third word line in a selection state out of said plurality of third word lines,
- said semiconductor storage further comprising:
- a first row decoder for simultaneously bringing any of said first word lines and any of said second word lines into a selection state based on a first address signal;
- a second row decoder for bringing any of said plurality of third word lines into a selection state based on a second address signal; and
- a third memory cell array having a plurality of second dummy cells arranged in at least a column over a plurality of rows, said first and third memory cell arrays being formed integrally with said second memory cell array interposed therebetween and the number of accessible ports of said second dummy cell being set to be smaller than that of accessible ports of said memory cells for a real operation,
- said memory cells for a real operation including a memory cell having a 2-port structure with first and second ports which are accessible,
- said first and second dummy cells including a memory cell having a 1-port structure with first and second dummy ports which are accessible,
- said first ports of said plurality of memory cells for a real operation and said first dummy ports of said plurality of first dummy cells being connected to said plurality of common word lines on a row unit in common,
- said second ports of said plurality of memory cells for a real operation and said second dummy ports of said plurality of second dummy cells being connected to said plurality of third word lines on a row unit in common,
- said first row decoder including a row decoder provided in the vicinity of said first memory cell array, and
- said second row decoder including a row decoder provided in the vicinity of said third memory cell array.

16. The semiconductor storage according to claim 15, wherein
said first and second dummy cells include a memory cell for reading timing regulation with respect to said memory cell for a real operation.

17. A semiconductor storage comprising first and second memory cell arrays,
said first memory cell array including:
a plurality of first memory cells arranged in at least one column over a plurality of rows; and
a plurality of first word lines to be connected to said first memory cells on a row unit,
a plurality of second word lines to be connected to said first memory cells on a row unit,
a plurality of first bit lines provided corresponding to said first memory cells on a column unit and being accessible to said first memory cell connected to said first word line in a selection state out of said plurality of first word lines; and
a plurality of second bit lines provided corresponding to said first memory cells on a column unit and being accessible to said first memory cell connected to said second word line in a selection state out of said plurality of second word lines,
said second memory cell array including:
a plurality of second memory cells arranged in a matrix, said second word lines not being connected to any of said second memory cells;
a plurality of third word lines to be connected to said second memory cells on a row unit;
a plurality of fourth word lines connected to said second memory cells on a row unit and not connected to any of said first memory cells;
a plurality of third bit lines provided corresponding to said second memory cells on a column unit and being accessible to said second memory cell connected to said third word line in a selection state out of said plurality of third word lines; and
a plurality of fourth bit lines provided corresponding to said second memory cells on a column unit and being accessible to said second memory cell connected to said fourth word line in a selection state out of said plurality of fourth word lines,
said semiconductor storage further comprising:
a first row decoder configured to select so that a period wherein any of said first word lines is brought into a selection state based on a first address signal and a period wherein any of said third word lines is brought into a selection state based on said first address signal are overlapped,
a second row decoder configured to bring any of said of second word lines into a selection state based on a second address signal; and
a third row decoder configured to bring any of said of fourth word lines into a selection state based on a third address signal, wherein
said first memory cell includes a memory cell having a 2-port structure which can be accessed by a first port and a second port,
said second memory cell including a memory cell having a 2-port structure which can be accessed by said first port and a third port which is different from said second port,
an access to be carried out by setting said first and third word lines into a selection state by said first row decoder including an access to be preformed by said first port,
an access to be carried out by setting said second word line into a selection state by said second row decoder including an access to be performed by said second port, and
an access to be carried out by setting said fourth word line into a selection state by said third row decoder including an access to be performed by said third port.

18. The semiconductor storage according to claim 17, wherein
said second and third row decoders are arranged with said first and second memory cell arrays interposed therebetween.

* * * * *